United States Patent [19]
Kanai et al.

[11] Patent Number: 5,220,181
[45] Date of Patent: Jun. 15, 1993

[54] PHOTOVOLTAIC ELEMENT OF JUNCTION TYPE WITH AN ORGANIC SEMICONDUCTOR LAYER FORMED OF A POLYSILANE COMPOUND

[75] Inventors: Masahiro Kanai, Tokyo; Hisami Tanaka, Yokohama; Harumi Sakou, Tokyo, all of Japan

[73] Assignee: Canon Kabushiki Kaisha, Tokyo, Japan

[21] Appl. No.: 825,281

[22] Filed: Jan. 15, 1992

Related U.S. Application Data

[63] Continuation of Ser. No. 625.021. Dec. 10, 1990, abandoned.

Foreign Application Priority Data

Dec. 11, 1989 [JP] Japan .................. 1-319005
Dec. 11, 1989 [JP] Japan .................. 1-319006
Dec. 11, 1989 [JP] Japan .................. 1-319007

[51] Int. Cl.⁵ .......................................... H01L 29/28
[52] U.S. Cl. .................................. 257/40; 257/449; 257/461; 257/471
[58] Field of Search ............... 357/8, 2, 30 K; 430/58; 257/40, 289, 290, 449, 461, 471; 437/1

References Cited

U.S. PATENT DOCUMENTS

| | | | |
|---|---|---|---|
| 4,618,551 | 10/1986 | Stolka et al. | 430/58 |
| 4,772,525 | 9/1988 | Badesha et al. | 430/58 |
| 4,839,451 | 6/1989 | Badesha et al. | 528/10 |
| 4,855,201 | 8/1989 | Badesha et al. | 430/58 |

FOREIGN PATENT DOCUMENTS

| | | |
|---|---|---|
| 60-98431 | 6/1985 | Japan . |
| 60-119550 | 6/1985 | Japan . |
| 62-269964 | 11/1987 | Japan . |
| 63-38033 | 7/1988 | Japan . |

OTHER PUBLICATIONS

Kepler, R. G. et al. "Photocarrier generation and transport in $\sigma$-bonded polysilanes", Physical Review B, vol. 35, No. 6, Feb. 15, 1987, pp. 2818–2822.
Mazdiyasni, K. S. et al. "Characterization of Organosilicon-Infiltrated Porous Reaction-Sintered $Si_3N_4$", Journal of the American Ceramic Society, vol. 61, No. 11–12, Nov.-Dec. 1978, pp.504–508.

*Primary Examiner*—Andrew J. James
*Assistant Examiner*—Sara W. Crane
*Attorney, Agent, or Firm*—Fitzpatrick, Cella, Harper & Scinto

[57] ABSTRACT

An improved junction type photovoltaic element, characterized by having an organic semiconductor layer formed of a polysilane compound of 6000 to 200000 in weight average molecular weight which is represented by the following general formula (I):

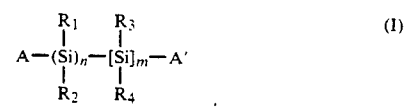

Wherein, $R_1$ stands for an alkyl group of 1 to 2 carbon atoms; $R_2$ stands for an alkyl group, cycloalkyl group, aryl group or aralkyl group of 3 to 8 carbon atoms; $R_3$ stands for an alkyl group of 1 to 4 carbon atoms; $R_4$ stands for an alkyl group of 1 to 4 carbon atoms; A and A' respectively stands for an alkyl group, cycloalkyl group, aryl group or aralkyl group of 4 to 12 carbon atoms wherein the two substituents may be the same or different one from the other; and each of n and m is a mole ratio showing the proportion of the number of respective monomers versus the total of the monomers in the polymer wherein $n+m=1$, $0<n\leq 1$ and $0\leq m<1$.

5 Claims, 3 Drawing Sheets

PHOTOVOLTAIC ELEMENT OF JUNCTION TYPE WITH AN ORGANIC SEMICONDUCTOR LAYER FORMED OF A POLYSILANE COMPOUND

This application is a continuation of application Ser. No. 07/625,021 filed Dec. 10, 1990, now abandoned.

FIELD OF THE INVENTION

The present invention relates to an improved photovoltaic element of junction type such as SIS, MIS or Schottky junction type with an organic semiconductor layer formed of a polysilane compound having a weight average molecular weight of 6000 to 200000.

BACKGROUND OF THE INVENTION

In the past, there were proposed a variety of photovoltaic elements with an organic semiconductor layer (these photovoltaic elements will be hereinafter referred to as "organic photovoltaic elements"). However, for any of those known organic photovoltaic elements, there are problems that the light collecting efficiency is extremely low and thus, the photoelectric conversion efficiency is extremely low accordingly. Because of this, research works in order to put organic photovoltaic elements to practical use have been delayed in comparison with those on pn or pin junction photovoltaic elements with a semiconductor layer comprising a crystalline or amorphous silicon.

In recent years, attention has been directed to use of an organic semiconductor film in a photovoltaic element since such organic semiconductor film can be easily formed without using a specific apparatus as in the case of forming a crystalline or amorphous silicon semiconductor film and at a reduced cost. And research works have been made in order to develop a practical usable organic semiconductor film which makes the resulting photovoltaic element to exhibit a desirably high photoelectric conversion efficiency.

Now, in Appl. Phys. Lett., 32, 495(1978), J. Chem. Phys., 71, 1211(1979) or Jpn. J. Appl. Phys. 20, Suppl. 20-2, 135 (1980), it is described that organic semiconductor materials i.e. anthracene, tetracene, merocyanine, phthalocyanine, hydroxy squarylium (OHSq in abbreviation) [see, Appl. Phys. Lett., 29, 414(1976)], chlorophyll and pyrrole are usable in photovoltaic elements, and Schottky type photovoltaic elements prepared by using these semiconductor materials provide a photoelectric conversion efficiency of about 0.2 to 1% with irradiation of AM-O spectrum light. As for the reason why these photovoltaic elements are such that merely provide such a low photoelectric conversion efficiency, it is not clear enough at the present stage, but there have been illustrated such factors that the density of a carrier trap particularly in the organic semiconductor is large; the lifetime and hole mobility of a photocarrier are small; and the diffusion length of a photocarrier is short. In addition to these, there have been illustrated other factors that the organic semiconductor hardly provides an ohmic contact since it has a large electrical resistivity, and the photoelectric conversion efficiency is decreased as the intensity of light impinged is heightened.

Now, the public attention has been focused on polysilane compounds which are expected to replace the foregoing organic semiconductor materials which are problematic when used in photovoltaic elements.

Now, in The Journal of American Chemical Society, 125, pp. 2291 (1924), polysilanes are reported to be insoluble in solvents. In recent years, since it was reported in The Journal of American Ceramic Society, 61, pp. 504 (1978) that polysilanes are soluble in solvents and films can be made of them, the public attention has been focussed on polysilanes. Japanese Unexamined Patent Publications Sho. 60(1985)-98431 and Sho. 60(1985)-119550 disclose polysilanes which can be dissociated with ultraviolet rays and utilization of them in resists. Further, Physical Review B 35, pp. 2818 (1987) discloses polysilanes having photosemiconductor characteristics in which carriers are mobile due to $\sigma$-bonds of their principal chains. And these polysilanes are expected to be usable also in electrophotographic photosensitive members. However, in order that polysilane compounds be applicable in electronic materials, those polysilane compounds are required to be such that are soluble in solvents and capable of providing films which are not accompanied by minute defects and excel in homogeneity. The electronic materials should not be accompanied by any minute defects and because of this, polysilane compounds to be used in the preparation of such electronic materials are required to be high quality polysilane compounds, which can be structurally defined also with respect to substituents and do not cause any abnormality upon film formation.

There have been made various reports of synthesis of polysilane compounds. Those polysilane compounds reported are still problematic in using them in electronic materials. In The Journal of American Chemical Society 91(11), pp. 3806 (1972) and Japanese Patent Publication Sho. 63(1988)-38033, there are disclosed low-molecular weight polysilane compounds in which all the Si radicals being substituted by organic groups. Those described in the former literature are of the structure in which the end group of dimethylsilane being substituted by a methyl group. Those described in the latter literature are of the structure in which the end group of dimethylsilane being substituted by an alcoxy group. Each of them is 2 to 6 in degree of polymerization and does not exhibit characteristics as the polymer. Particularly in this respect, each of them does not have an ability of forming a film as it is and is not industrially applicable. High-molecular weight polysilane compounds of the structure in which all the Si radicals being substituted by organic groups are reported in Nikkei New Material, pp, 46, Aug. 15, 1988. These are synthesized through specific intermediates to cause reduction in their yield and it is difficult to mass-produce these on the industrial scale.

In addition, method of synthesizing polysilane compounds are reported by The Journal of Organometallic Chemistry, pp. 198 C27 (1980) and The Journal of Polymer Science, Polymer Chemistry Edition vol. 22, pp. 159-170 (1984). However, any of these synthetic method is directed only to condensation reaction of the polysilane principal chain but does not touch upon the end groups. And, is any of these synthetic methods, unreacted chlorine radicals and by-products due to side reactions are caused, and it is difficult to obtain stably polysilane compounds as desired.

Use of such polysilane compounds as described above as a photoconductive material are proposed by U.S. Pat. No. 4,618,551, U.S. Pat. No. 4,772,525 and Japanese Unexamined Patent Publication Sho. 62(1987)-269964. However, in any of these cases, occurrence of undesirable negative effects due to said unreacted chlorine radicals and said by-products caused by side reactions are considered.

In U.S. Pat. No. 4,618,551, the foregoing polysilane compounds are used in electrophotographic photosensitive members and an extremely high voltage of 1000 V is applied upon use of those photosensitive members, although a voltage of 500 to 800 V is applied in an ordinary electrophotographic copying machine.

It is considered that this is done in order to prevent occurrence of spotted abnormal phenomena on images reproduced since defects due to the structural defects of the polysilane compound will cause in the electrophotographic photosensitive member at an ordinary potential. In Japanese Unexamined Patent Publication Sho. 62(1987)269964, electrophotographic photosensitive members are prepared by using the foregoing polysilane compounds and a photosensitivity is observed for each of them. However, any of those electrophotographic photosensitive members is not sufficient in photosensitivity and is inferior to the known selenium photosensitive member or the known organic photosensitive member in any respect.

There area number of unsolved problems for any of the known polysilane compounds to be utilized in the electronic materials. At the present time, any polysilane compound which can be desirably used in the preparation of electric or electronic devices are not yet realized.

SUMMARY OF THE INVENTION

The present invention is aimed at providing an improved organic photovoltaic element of junction type with an organic semiconductor layer which stably provides a desirable photoelectric conversion efficiency without being deteriorated even upon repeated use for a long period of time and which can be easily mass-produced.

Another object of the present invention is to provide an improved organic photovoltaic element of junction type having an organic semiconductor layer formed of a specific polysilane compound which surpasses the known organic semiconductor with respect to exhibiting characteristics required for a photovoltaic element.

A further object of the present invention is to provide an improved organic photovoltaic element of junction type having an organic semiconductor layer formed of a specific polysilane compound, which have never been used in the field of photovoltaic element, which is stable against changes in the intensity of light to be impinged and which is hardly deteriorated even upon repeating use for a long period of time.

Still further object of the present invention is to provide an improved organic photovoltaic element of SIS, MIS or Shottky junction type, having an organic semiconductor layer formed of the foregoing specific polysilane compound, which stably provides a desirable photoelectric conversion efficiency without being deteriorated even upon repeating use for a long period of time.

These and other objects, as well as the features of the present invention will become apparent by reading the following descriptions of preferred embodiments according to the present invention while referring to the accompanying drawings.

DETAILED DESCRIPTION OF THE INVENTION

Figure 1A:
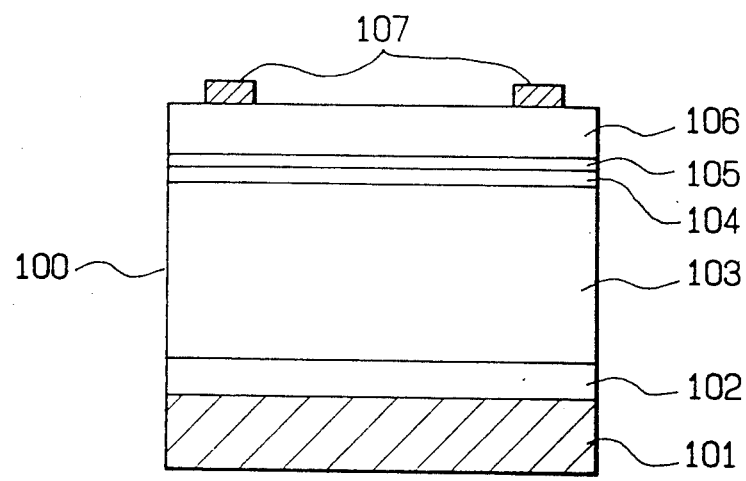
FIGS. 1(A) and 1(B) are schematic representations showing the typical configuration of a MIS junction type organic photovoltaic element according to the present invention.

In order to attain the above objects of the invention, the present inventors made studies on the new polysilane compounds having a weight-average molecular weight of 6000 to 200000 wherein all the silicon groups are substituted by specific oxygen-free organic groups, as were previously developed by two of the three inventors of the present invention, these studies were done to determine whether or not those polysilane compounds are effective in the preparation of a desirable organic photovoltaic element of junction type. As a result, it was found that those polysilane compounds are surpassing the known semiconductor compounds with respect to exhibiting the characteristics required for a photovoltaic element and they are effectively usable in the preparation of a photovoltaic element. The present inventors prepared a plurality of photovoltaic elements respectively provided with a semiconductor layer formed by using one of those polysilane compounds, and the resultant photovoltaic elements were evaluated with respect to various evaluation items. As a result, it was found that any of the resultant photovoltaic elements provides desirable photovoltaic characteristics and they are practically usable as a power source.

The present invention has been accomplished based on the above findings.

Thus, the present invention provides an improved junction type organic photovoltaic element.

The junction type organic photovoltaic element according to the present invention is characterized by having an organic semiconductor layer formed of a specific polysilane compound having a weight-average molecular weight of 6000 to 200000 which is represented by the general formula (I) which will be hereunder mentioned. The junction type organic photovoltaic element to be provided according to the present invention includes a SIS junction type organic photovoltaic element, a MIS junction type organic photovoltaic element, and a Schottky junction type organic photovoltaic element.

The above polysilane compound having a weight-average molecular weight of 6000 to 200000 to be used in the present invention is represented by the following general formula (I):

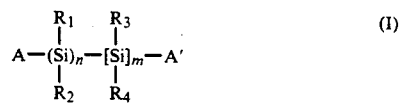

[Wherein, $R_1$ stands for an albyl group of 1 to 2 carbon atoms; $R_2$ stands for an alkyl group, cycloalkyl group, aryl group or aralkyl group of 3 to 8 carbon atoms; $R_3$ stands for an alkyl group of 1 to 4 carbon atoms; $R_4$ stands for an alkyl group of 1 to 4 carbon atoms; A and A' respectively stands for an alkyl group, cycloalkyl group, aryl group or aralkyl group of 4 to 12 carbon atoms wherein the two substituents may be the same or different one from the other; and each of n and m is a mole ratio showing the proportion of the number of respective monomers versus the total of the monomers in the polymer wherein $n+m=1$, $0<n\leq 1$ and $0\leq m<1$.]

Specifically, each of the foregoing substituent end groups A and A' is an organic group selected from the group consisting of alkyl groups such as methyl group, ethyl group and isopropyl group; cycloalkyl groups such as cyclopentyl group and cyclohexyl group; aryl groups such as phenyl group, tolyl group, xylyl group, diphenyl group, dimethylaminophenyl group and methoxyphenyl group; and aralkyl groups such as benzyl group and phenetyl group.

Likewise, each of the foregoing substituent groups $R_1$, $R_2$, $R_3$ and $R_4$ is an organic group selected from the group consisting of alkyl groups such as methyl group, ethyl group and isopropyl group; cycloalkyl groups such as cyclopentyl group and cyclohexyl group; aryl groups such as phenyl group, tolyl group, xylyl group, diphenyl group, dimethylaminophenyl group and methoxyphenyl group; and aralkyl groups such as benzyl group and phenetyl group.

As above described, the polysilane compound to be used in the present invention is represented by the foregoing formula (I) and has a weight-average molecular weight in the range of from 6000 to 200000. In a preferred embodiment, in the viewpoints of desirable solubility in solvents and desirable film-forming ability, the polysilane compound is of a weight-average molecular weight preferably in the range of from 8000 to 120000, more preferably in the range of from 10000 to 80000.

Polysilane compounds of less than 6000 in weight-average molecular weight do not exhibit polymer characteristics and do not have a film-forming ability. On the other hand, polysilane compounds exceeding 200000 in weight-average molecular weight are poor with respect to solubility in solvents, and it is difficult to form films therefrom.

The polysilane compound to be used in the present invention possesses neither chlorine-containing group nor side reaction—causing group in which all the Si radicals being substituted by specific organic groups not containing any oxygen atom. The polysilane compound is innoxious, easily soluble in aromatic solvents such as toluene, benzene, xylene, etc., halogenated solvents such as dichloromethane, dichloroethane, chloroform, carbon tetrachloride, etc., and other solvents such as tetrahydrofuran (THF), dioxane, etc., and has an excellent film-forming ability.

The film formed of the polysilane compound is homogenous uniform in thickness, has an excellent heat-resistance and excels in hardness and toughness.

The foregoing polysilane compound can be synthesized in the following manner. That is, under high purity inactive atmosphere containing neither oxygen nor water, dichlorosilane monomer in a solvent is contacted with a condensation catalyst comprising an alkaline metal to conduct dehalogenation and condensation polymerization, to thereby synthesize an intermediate polymer. The intermediate polymer thus obtained is separated from unreacted monomer and is reacted with a selected halogenating organic reagent in the presence of a condensation catalyst comprising an alkaline metal to condense an organic group to the terminals of the intermediate polymer, thereby obtaining the polysilane compound.

In the above synthesizing process, as any of the foregoing dichlorosilane monomer, intermediate polymer, halogenating organic reagent and alkaline metal condensation catalyst is highly reactive with oxygen and water, the foregoing polysilane compound cannot be obtained under such atmosphere wherein oxygen and-/or water are present.

Therefore, in the foregoing procedures of obtaining the polysilane compound to be used in the present invention it is necessary that the procedure be carried out under the atmosphere containing neither oxygen nor water. Thus, due regard is to be made that all the reagents to be used and the reaction vessel to be used contain neither oxygen nor water and the reaction system is not incorporated with oxygen or/and water during the synthesizing process. Specifically, with respect to the reaction vessel to be used, it is subjected to vacuum suction and argon gas substitution in a blow box, thereby eliminating adsorption of water or/and oxygen in the inside of said vessel.

As for the argon gas used in any case, it is necessary that argon gas is dehydrated by passing it through a silica gel column; oxygen is then removed therefrom by passing the dehydrated argon through a column charged with copper powder which is maintained at 100° C. and the argon gas thus treated is used. Likewise, for the dichlorosilane monomer; prior to its introduction into the reaction system, oxygen is removed therefrom by subjecting it to vacuum distillation with the use of said treated argon gas free of oxygen, and thereafter it is introduced into the reaction system.

The halogenating organic reagent to be used and the solvent to be used are also treated to be free of oxygen in the same manner as in the above case of treating the dichlorosilane monomer and they are introduced into the reaction system. As for the solvent, it is desired to be treated such that after being subjected to vacuum distillation with the use of the foregoing argon gas, the solvent is further treated with a metallic sodium to be completely free of water.

As the foregoing condensation catalyst, a wire-like shaped alkaline metal or chipped alkaline metals are used. In order to obtain said wired alkaline metal or chipped alkaline metals, the starting alkaline metal is wired or chipped in a paraffinic solvent free of oxygen and the resultant is used while having due regard not to cause oxidation thereof.

As the starting dichlorosilane monomer to be used for producing the polysilane compound of the foregoing formula (I) in the present invention, there is selectively used a silane compound represented by the formula: $R_1R_2SiCl_2$ which will be later detailed or in addition, also selectively used a silane compound represented by the formula: $R_3R_4SiCl_2$ which will be later detailed.

As the foregoing condensation catalyst, it is desired to use an alkaline metal capable of causing dehalogenation and providing condensation reaction. Specific examples of such alkaline metal are lithium, sodium and potassium, among these, lithium and sodium being the most preferred.

The foregoing halogenating organic reagent is used for the introduction of a substituent represented by the A and a substituent represented by the A'. As such halogenating organic reagent, there is used a relevant compound selected from the group consisting of halogenated-alkyl compounds, halogenated-cycloalkyl compounds, halogenated-aryl compounds and halogenated-aralkyl compounds, that is, a relevant compound selected from the compounds represented by the general formula: A—X and/or a compound selected from the compounds represented by the general formula: A'—X (wherein X is Cl or Br) which will be later illustrated.

As for the foregoing dichlorosilane monomer represented by the general formula: $R_1R_2SiCl_2$ or the foregoing dichlorosilane monomer represented by the general formula: $R_3R_4SiCl_2$ which is additionally used, they are dissolved in predetermined solvents and introduced into the reaction system. As such solvent, it is desired to use nonpolar paraffinic hydrocarbon solvents. Specific examples of such nonpolar solvent are n-hexane, n-octane, n-nonane, n-dodecane, cyclohexane, cyclooctane, etc.

The intermediate polymer synthesized is insoluble in any of these solvents and thus, it can be effectively separated from the unreacted dichlorosilane monomer.

At the time of reacting the intermediate polymer separated from the unreacted dichlorosilane monomer with the halogenating organic reagent, they are dissolved in the same solvent and they are reacted. In this case, there is desirably used an aromatic solvent such as benzene, toluene, xylene, etc. as said solvent.

In order to obtain a desired intermediate polymer by condensating the foregoing dichlorosilane monomer with the use of the foregoing alkaline metal catalyst, the polymerization degree of the resulting intermediate polymer can be controlled as desired by properly adjusting the reaction temperature and the reaction period of time. However, as for the reaction temperature, it is desired to be regulated in the range of from 60° C. to 130° C.

A preferred embodiment of the method for producing the foregoing polysilane compound represented by the formula (I) in the present invention is to be explained in the following.

That is, the method for producing said polysilane compound comprises the steps of: (i) producing the intermediate polymer and (ii) introducing the substituents A and A' to the terminals of said intermediate polymer.

The step (i) can be carried out as follows. That is, the inside of the reaction system of the reaction vessel is made substantially free of oxygen and water, charged with argon gas and the gas pressure thereof is maintained at a predetermined value. A paraffinic solvent free of oxygen and a condensation catalyst free of oxygen are introduced into the reaction system, and dichlorosilane monomer(s) free of oxygen is introduced thereinto. The reactants thus introduced into the reaction system were heated to a predetermined temperature while mixing them to cause condensation of said monomer. In this case, the condensation degree of said dichlorosilane monomer is controlled as desired by properly regulating the reaction temperature and the reaction period of time, to thereby obtain an intermediate polymer having a desired polymerization degree.

The reaction in this case is performed in the way as shown in the following reaction formula (A), wherein the chlorine radicals of the two dichlorosilane monomers and the condensation catalyst are reacted to cause dechlorination reaction wherein the Si radicals are repeatedly condensated and polymerized, thereby forming an intermediate polymer.

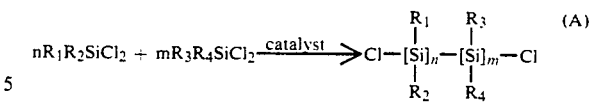

The reaction procedures in the above are made such that the condensation catalyst (alkaline metal) is firstly placed in the paraffinic solvent, into which the dichlorosilane monomers are dropwise introduced while stirring the reaction mixture and maintaining it at an elevated temperature. The polymerization degree of the resultant is confirmed by sampling the reaction liquid. The confirmation of the polymerization can be simply conducted by observing from the state of the sampled reaction liquid if a film can be formed or not therefrom. When condensation proceeds to form a polymer, said polymer becomes precipitated in the form of white solid in the reaction liquid. When such white solid is precipitated as desired, the reaction liquid containing the white solid is cooled and decanted to separate the precipitate from the solvent. Thus, there is afforded an intermediate polymer. Then, the foregoing step (ii) is carried out. That is, the intermediate polymer thus obtained is subjected to dechlorination condensation with the use of the halogenating organic reagent and the condensation catalyst (alkaline metal), to thereby substitute the end groups of said intermediate polymer by predetermined organic groups. The reaction in this case is performed in the way as shown in the following reaction formula (B).

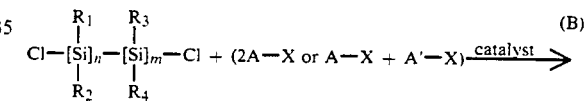

Specifically in this respect, the intermediate polymer obtained by condensation of the dichlorosilane monomers is dissolved in the aromatic solvent. Then, the foregoing condensation catalyst (alkaline metal) is added to the solution, and the foregoing halogenating organic reagent is dropwise added at room temperature. Wherein said halogenating organic reagent is added in an excessive amount of 0.01 to 0.1 holds over the amount of the starting monomer. The reaction mixture is gradually heated, and it is stirred for an hour while maintaining at a temperature of 80° C. to 100° C. to thereby perform the reaction as desired.

After the reaction is completed, methanol is added in order to remove the alkaline metal as the catalyst. Then, the polysilane compound resulted is extracted with toluene and purified with the use of a silica gel column. Thus, there is obtained an objective polysilane compound to be used in the present invention.

Specific Examples of the $R_1R_2 SiCl_2$ and $R_3R_4 SiCl_2$

Note: Among the following compounds, compounds of a-2 to a-16, a-18, a-20, a-21, a-23 and a-24 are used as the $R_1R_2 SiCl_2$, and compounds of a-1, a-2, a-11, a-17, a-19, a-22, a-23 and a-25 as the $R_3R_4 SiCl_2$.

| | |
|---|---|
| $(CH_3)_2SiCl_2$ | a-1 |
| $CH_3(CH_2)_3$—Si(CH_3)Cl_2 | a-2 |
| 4-CH_3-C_6H_4-Si(CH_3)Cl_2 | a-3 |
| 4-CH_3-C_6H_4-Si(CH_3CH_2)Cl_2 | a-4 |
| C_6H_5-Si(C_2H_5)Cl_2 | a-5 |
| 4-CH_3CH_2-C_6H_4-Si(CH_3CH_2)Cl_2 | a-6 |
| C_6H_5-Si(CH_3)Cl_2 | a-7 |
| C_6H_5-C_2H_4-Si(CH_3)Cl_2 | a-8 |
| $CH_3(CH_2)_6$—Si(CH_3)Cl_2 | a-9 |
| $CH_3(CH_2)_7$—Si(CH_3)Cl_2 | a-10 |
| $(CH_3)_2CH$—Si(CH_3)Cl_2 | a-11 |
| $CH_3(CH_2)_{11}$—Si(CH_3)Cl_2 | a-12 |
| Cyclohexyl-Si(CH_3)Cl_2 | a-13 |

-continued

| | |
|---|---|
| Cyclohexyl-CH_2CH_2-Si(CH_3)Cl_2 | a-14 |
| C_6H_5-CH_2-Si(CH_3)Cl_2 | a-15 |
| $CH_3(CH_2)_5$—Si(CH_3)Cl_2 | a-16 |
| Si(C_2H_5)(CH_3)Cl_2 | a-17 |
| $(CH_3)_3CCH_2$—Si(CH_3)Cl_2 | a-18 |
| $CH_3(CH_2)_3$—Si(CH_3(CH_2)_3)Cl_2 | a-19 |
| 2-CH_3-C_6H_4-Si(CH_3)Cl_2 | a-20 |
| 4-CH_3CH_2-C_6H_4-Si(CH_3)Cl_2 | a-21 |
| $((CH_3)_2CH)_2SiCl_2$ | a-22 |
| Si(CH_3CH_2)((CH_3)_2CH)Cl_2 | a-23 |
| C_6H_5-CH_2CH_2-Si(CH_3CH_2)Cl_2 | a-24 |
| $((CH_3)_3C)_2SiCl_2$ | a-25 |

Specific Examples of the A—X and the A'—X

| | |
|---|---|
| $(CH_3)_2CHCH_2Cl$ | b-1 |
| $CH_3(CH_2)_4Cl$ | b-2 |
| $CH_3(CH_2)_5Cl$ | b-3 |
| $CH_3(CH_2)_{10}Cl$ | b-4 |
| Cyclohexyl-Cl | b-5 |

-continued
b-6 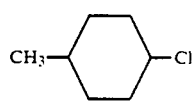
b-7 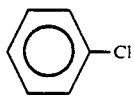
b-8 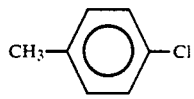
b-9 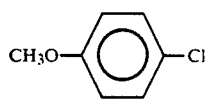
b-10 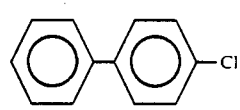
b-11 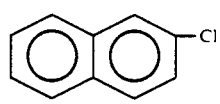
b-12 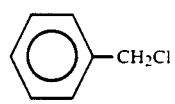
b-13 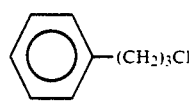
b-14 CH₃(CH₂)₅Br
b-15 CH₃(CH₂)₁₀Br
b-16 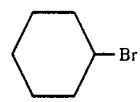
b-17 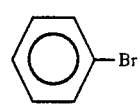
Specific Examples of the polysilane compound to be used in the present invention.
c-1 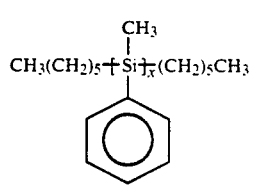
-continued
c-2 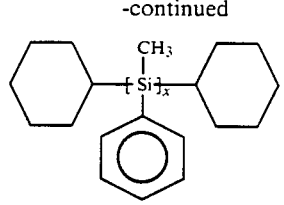
c-3 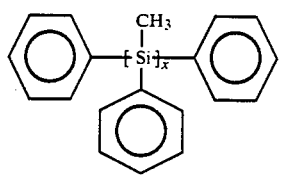
c-4 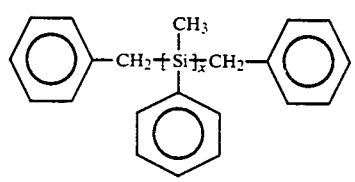
c-5 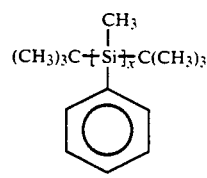
c-6 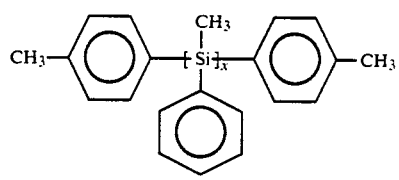
c-7 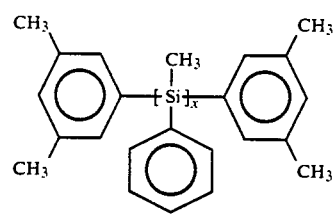
c-8 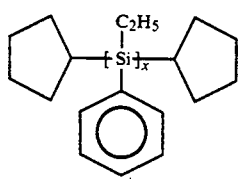
c-9 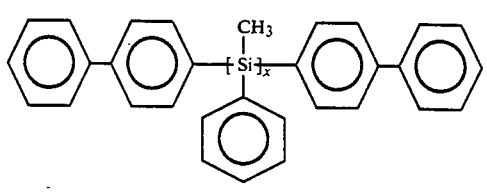

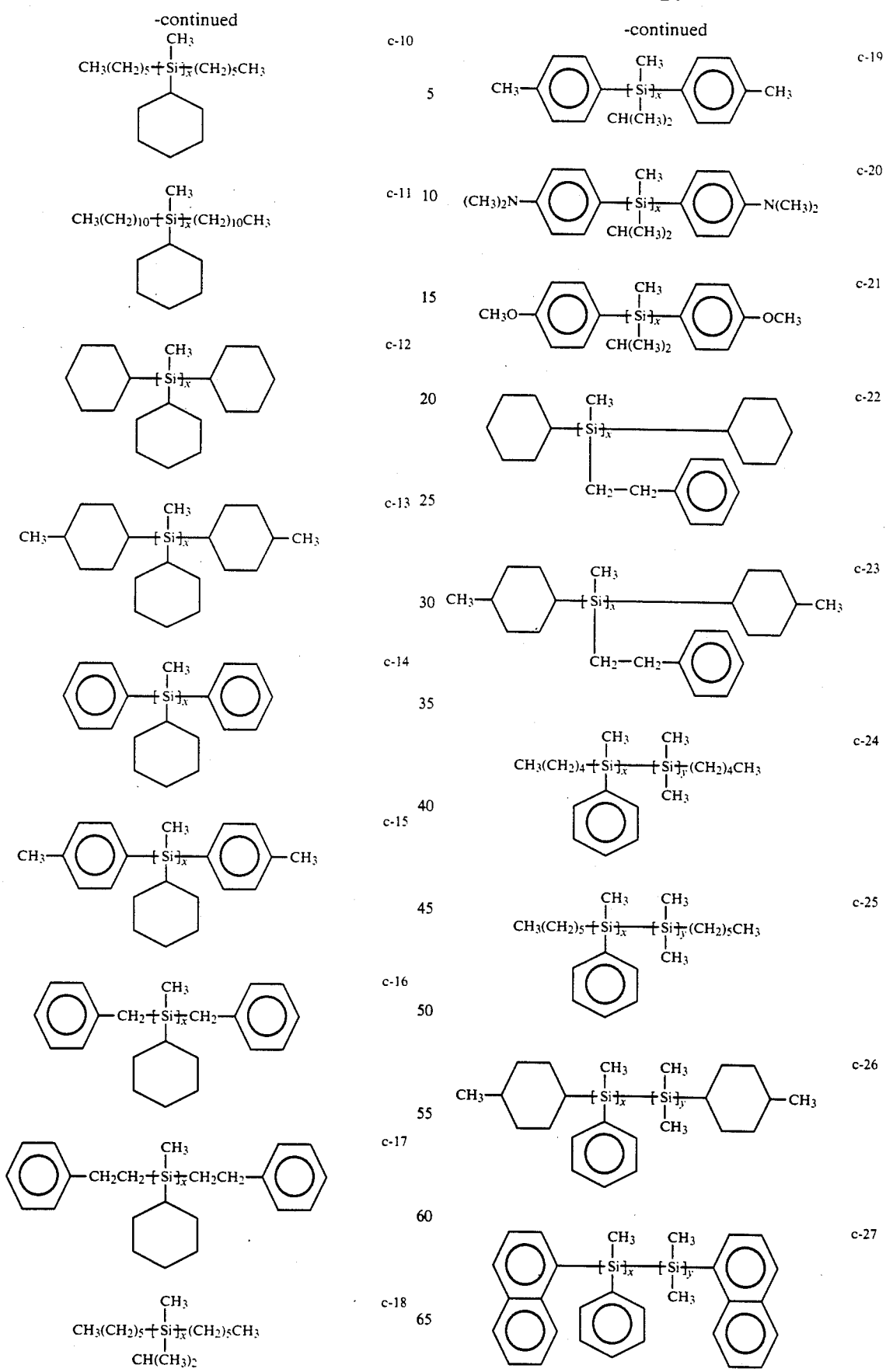

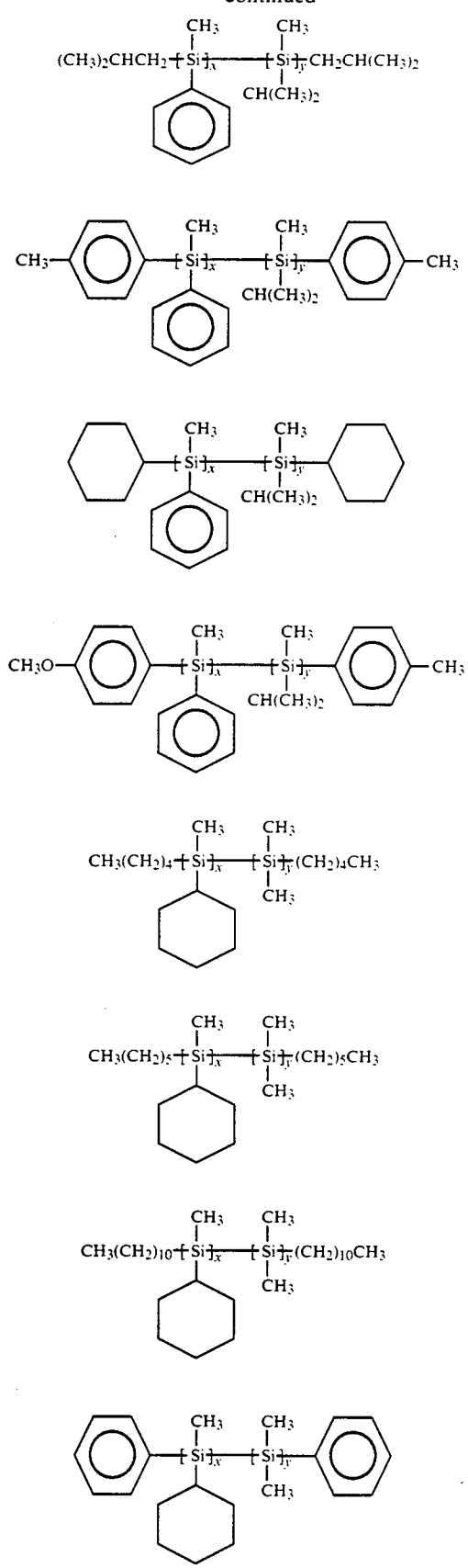
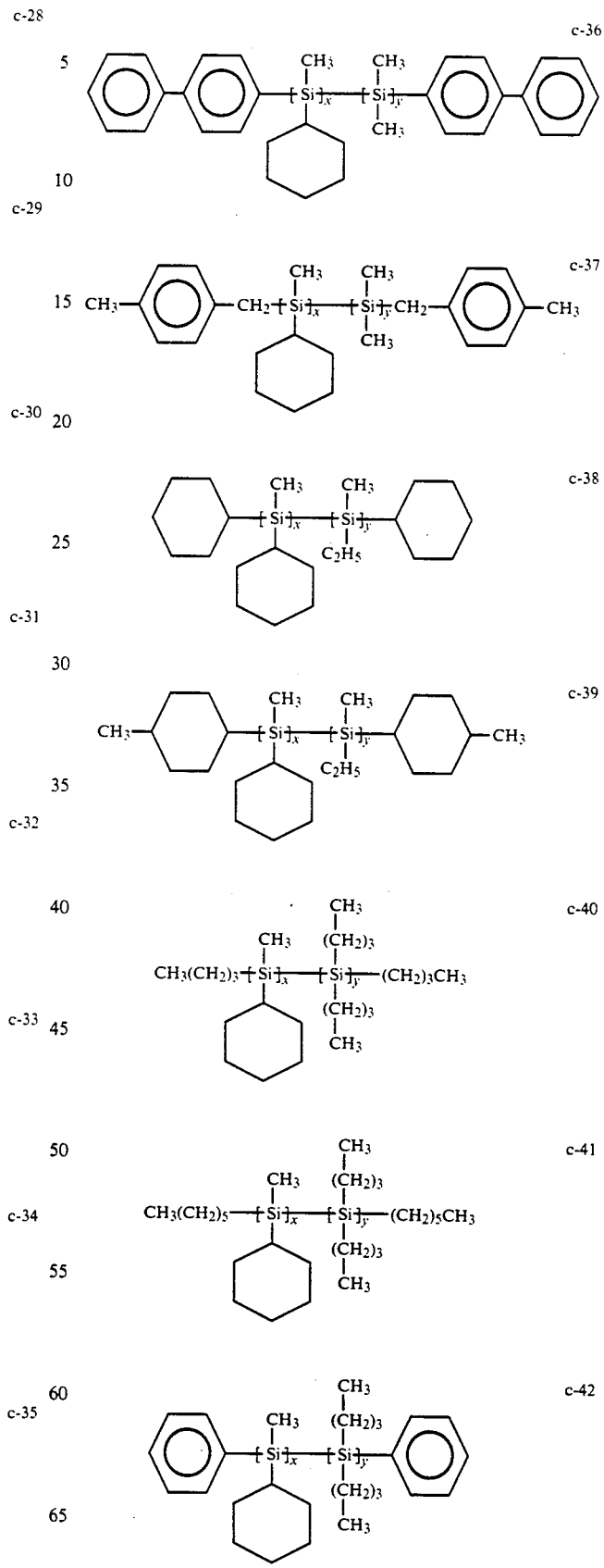

-continued

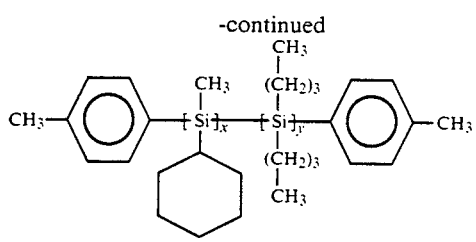

c-43

Note:
X and Y in the above structural formulas respectively stands for a polymeric unit of the monomer.
n is obtained by the calculation equation: X/(X + Y), and
m is obtained by the calculation equation: Y/(X + Y).

EXAMPLES OF SYNTHESIS

In the following, examples obtaining the foregoing polysilane compounds represented by the foregoing formula(I) to be used in the present invention will be described.

In the following synthesis examples and comparative synthesis examples, as for the product obtained, the presence or absence of Cl radical was firstly observed. The product in which the presence of Cl radical was recognized was subjected to determination of the content of Cl radical. The measured content thereof was expressed by the milimolar equivalence number per 1000 g of the product.

In addition, as for the product obtained, whether it corresponds or not to a polysilane compound having a backbone chain comprising a Si—Si bonded long chain structure was observed by FT-IR and/or UV spectrum. Further in addition, the presence or absence of a side chain substituent to have been bonded was observed by FT-IR, or/and the proton in the substituent was observed by FT-NMR.

On the basis of the results obtained, the structure of the synthesized product was determined.

The foregoing observation of the presence or absence of Cl radical was performed by using a full-automatic X-ray fluorescence analyzing system 3080 (product by Rigakudenki Kohgyo Kabushiki Kaisha). Wherein, there was provided trimethylchlorosilane (product by Chisso Kabushiki Kaisha) as a reference standard; five kinds of control solutions were prepared by diluting said reference standard with respective rates of dilution of 1, 5, 10, 50 and 100 times. Each of the control solutions was set to the above X-ray fluorescence analyzing system to measure the amount of Cl radical contained therein, and an analytical curve was obtained based on the measured results.

As for the product to be observed, 1 g thereof was dissolved in dehydrated toluene to obtain a specimen of 10 ml in a total amount. This was set to the above X-ray fluorescence analyzing system and the measured result was referred to the foregoing analytical curve to obtain the amount of Cl radical.

The measurement by FT-IR was performed by preparing a KBr pellet of the specimen to be observed and setting the resultant to a Nicolet FT-IR 750 (product by Nicolet Japan Co., Ltd.).

The measurement by FT-NMR was performed by dissolving the specimen to be observed in $CdCl_2$ and setting the resultant to a FT-NMR FX-9Q (product by JEOL, Ltd.).

Additionally, Pure & Applied Chemistry 54, No. 5, pp. 1041-1050 (1982) reports with respect to UV spectra that in the case of a low molecular weight polysilane compound, its UV spectrum ranges in the short wavelength side and in the case of a high molecular weight polysilane compound, its UV spectrum ranges in the long wavelength side.

SYNTHESIS EXAMPLE 1

A three-necked flask was placed in a blow box which was vacuum-aspirated and charged with argon gas, and a reflux condenser, temperature gage and dropping funnel were provided to the device. And argon gas was passed through a by-pass pipe of the dropping funnel.

100 g of dehydrated dodecane and 0.3 moles of wire-like shaped metallic sodium were introduced into the three-necked flask and heated to 100° C. while stirring. Then, a solution prepared by dissolving 0.1 moles of dichlorosilane monomer (product by Chisso Kabushiki Kaisha)(a-7) in 30 g of dehydrated dodecane was dropwise added to the reaction system.

After its addition being completed, the reactants were subjected to condensation polymerization at 100° C. for an hour to precipitate white solids. Thereafter the resultant was cooled and the dodecane was decantated. 100 g of dehydrated toluene was added to dissolve the white solids, to which 0.01 moles of metallic sodium was added. Then, a solution prepared by dissolving 0.01 moles of n-hexylchloride (product by Tokyokasei Kabushiki Kaisha)(b-3) in 10 ml of toluene was dropwise and slowly added to the reaction system while stirring, followed by heating at 100° C. for an hour. After cooling, 50 ml of methanol was dropwise and slowly added to treat excessive metallic sodium. As a result, there were formed a suspended phase and a toluene phase. The toluene phase was separated, subjected to vacuum concentration, and purified by chromatography using a silica gel column to obtain a product with the yield of 65%.

The product thus obtained was examined by the foregoing method of measuring the content of Cl radical. As a result, there was not recognized any content of Cl radical (that is, 0.00 milimolar equivalence in 1000 g of the specimen.). As for the foregoing product, its weight average molecular weight was measured by subjecting the specimen to THF development in accordance with the known GPC method. It was 75,000 (wherein polystyrene was made to be the reference standard.).

Further, a KBr pellet of the foregoing product was prepared and it was set to a Nicolet FT-IR 750 (product by Nicolet Japan Co., Ltd.) to thereby measure its FT-IR. Further in addition, a specimen of the foregoing product was dissolved in $CDCl_2$ and set to a FT-NMR FX-90Q (product by JEOL, Ltd.) to measure its FT-NMR. As a result, it was found that the product does not contain any of Si—Cl bond, Si—O—Si bond and Si—O—R bond at all and corresponds to a polysilane compound having the foregoing structural formula C-I.

The above results were collectively shown in Table 5.

SYNTHESIS EXAMPLE 2

A three-necked flask was placed in a blow box which was vacuum-aspirated and charged with argon gas, and a reflux condenser, temperature gage and dropping funnel were provided to the device. Argon gas was passed through the by-pass pipe of the dropping funnel.

100 g of dehydrated dodecane and 0.3 moles of metallic lithium of 1 mm in size were introduced into the three-necked flask and heated to 100° C. while stirring. Then, a solution prepared by dissolving 0.1 moles of dichlorosilane monomer (product by Chisso Kabushiki Kaisha)(a-7) in 30 g of dehydrated dodecane was dropwise and slowly added to the reaction system. After its addition being completed, the reactants were subjected to condensation polymerization at 100° C. for 2 hours to precipitate white solids. The resultant was cooled and the dodecane was decantated. 100 g of dehydrated toluene was added to dissolve the white solids, to which 0.02 moles of metallic lithium was added. Then, a solution prepared by dissolving 0.02 moles of chlorobenzene (product by Tokyo Kasei Kabushiki Kaisha)(b-5) in 10 ml of toluene was dropwise and slowly added to the reaction system while stirring, followed by heating at 100° C. for an hour. After cooling, 50 ml of methanol was dropwise and slowly added to treat excessive metallic lithium. As a result, there were formed a suspended phase and a toluene phase. The toluene phase was separated, subjected to vacuum concentration, and purified by a chromatography using a silica gel column to obtain a product corresponding to a polysilane compound No. 2 (the structural formula: C-3). The yield was 72%, and its weight average molecular weight was 92,000. The determined results were shown in Table 5.

SYNTHESIS EXAMPLE 3

A three-necked flask was placed in a blow box which was vacuum-aspirated and charged with argon gas, and a reflux condenser, temperature gage and dropping funnel were provided to the device. Argon gas was passed through the by-pass pipe of the dropping funnel.

100 g of dehydrated n-hexane and 0.3 moles of metallic sodium of 1 mm in size were introduced into the three-necked flask and heated to 80° C. while stirring. Then, a solution prepared by dissolving 0.1 moles of dichlorosilane monomer (product by Chisso Kabushiki Kaisha)(a-7) in dehydrated n-hexane was dropwise and slowly added to the reaction system. After its addition being completed, the reactants were subjected to condensation polymerization at 80° C. for 3 hours to precipitate white solids. The resultant was cooled and the n-hexane was decantated. 100 g of dehydrated toluene was added to dissolve the white solids, to which 0.01 moles of metallic sodium was added. Then, a solution prepared by dissolving 0.01 moles of benzylchloride (product by Tokyo Kasei Kabushiki Kaisha)(b-12) in 10 ml of toluene was dropwise and slowly added to the reaction system while stirring, followed by heating at 80° C. for an hour. After cooling, 50 ml of methanol was dropwise and slowly added to treat excessive metallic sodium. As a result, there were formed a suspended phase and a toluene phase. The toluene phase was separated, subjected to vacuum concentration, and purified by a chromatography using a silica gel column to obtain a product corresponding to a polysilane compound No. 3 (the structural formula: C-4). The yield was 61%, and its weight average molecular weight was 47,000. The determined results were shown in Table 5.

Further, as for this polysilane compound, there was not present any IR absorption belonging to unreacted Si—Cl, or to Si—O—Si or Si—O—R of by-products.

SYNTHESIS EXAMPLES 4 AND 5

The synthesizing procedures of Example 3 were repeated, except that dichlorosilane monomer and end group treating agents shown in Table 1 were used, to thereby obtain a polysilane compound No. 4 and a polysilane compound No. 5 with respective yields of 60% and 62%.

For any of these polysilane compounds, there was not present any IR absorption belonging to unreacted Si—Cl, or to Si—O—Si or Si—O—R of by-products.

The determined results were collectively shown in Table 5.

COMPARATIVE SYNTHESIS EXAMPLE 1

The synthesizing procedures of Example 3 were repeated, except that neither the condensation using the dichlorosilane monomer (product by Chisso Kabushiki Kaisha)(a-7) nor the end group treatment of the polymer were performed, to obtain a polysilane compound No. D-1 having the structural formula shown in Table 5. The yield was 60% and its weight average molecular weight was 46,000. The determined results were shown in Table 5.

As for this polysilane compound, there were observed IR spectra belonging to unreacted Si—Cl for the end group and belonging to Si—O—R of a by-product.

SYNTHESIS EXAMPLES 6 TO 10

Polymerization was performed in the same manner as in Example 3, except for using a polysilane monomer shown in Table 2 and changing the reaction period as shown in Table 2. As the end group-treating agent, a compound shown in Table 2 was used. The product synthesized was purified in the same manner as in Example 3.

In this way, there were obtained polysilane compounds Nos. 6 to 10.

The yield, the weight average molecular weight, and the results by FT-IR and FT-NMR with respect to each of the polysilane compounds were as shown in Table 5.

For each of these polysilane compounds, there was not observed any IR absorption belonging to anreacted Si—Cl, or belonging to Si—O—Si or Si—O—R of by-products.

COMPARATIVE SYNTHESIS EXAMPLE 2

The procedures of Example 6 were repeated, except that the reaction period of the dichlorosilane monomer was made 10 minutes, to thereby obtain a polysilane compound No. D-2 shown in Table 5.

The yield, the weight average molecular weight, and the results by FT-IR and FT-NMR of the resultant polysilane compound were as shown in Table 5.

For the polysilane compound, there was not observed any IR absorption belonging to unreacted Si—Cl, or belonging to Si—O—Si or Si—O—R of by-products.

SYNTHESIS EXAMPLES 11 TO 14

The procedures of Example 1 were repeated, except that dichlorosilane monomers and end group-treating agents shown in Table 3 were selectively used, to thereby obtain polysilane compounds Nos. 11 to 14 shown in Table 5.

The yield, the weight average molecular weight, and the results by FT-IR and FT-NMR with respect to each of the resultant polysilane compounds were as shown in Table 5.

The copolymerized ratio of the silane monomer in each case was obtained by the number of protons in the NMR.

COMPARATIVE SYNTHESIS EXAMPLE 3

A three-necked flask was placed in a blow box which was vacuum-aspirated and charged with argon gas, and a reflux condenser, temperature gage and dropping funnel were provided to the device. Argon gas was passed through the by-pass pipe of the dropping funnel.

100 g of dehydrated dodecane and 0.3 moles of wire-like shaped metallic sodium were introduced into the three-necked flask and heated to 100° C. while stirring. Then, a solution prepared by dissolving 0.1 moles of dichlorosilane monomer (product by Chisso Kabushiki Kaisha) in 30 g of dehydrated dodecane was dropwise and slowly added to the reaction system. After its addition being completed, the reactants were subjected to condensation polymerization at 100° C. for an hour to precipitate white solids.

After cooling, 50 ml of methanol was dropwise and slowly added to treat excessive metallic sodium. Then, the resultant was subjected to filtration to thereby separate the white solids, which were repeatedly washed with n-hexane and methanol, to thereby obtain a polysilane compound No. D-3 shown in Table 5.

This polysilane compound was insoluble in organic solvents such as toluene, chloroform, THF, etc. Thus, its determination was performed by FT-IR. The results obtained were as shown in Table 5.

COMPARATIVE SYNTHESIS EXAMPLE 4

A three-necked flask was placed in a blow box which was vacuum-aspirated and charged with argon gas, and a reflux condenser, temperature gage and dropping funnel were provided to the device. Argon gas was passed through the by-pass pipe of the dropping funnel.

100 g of dehydrated dodecane and 0.3 moles of wire-like shaped metallic sodium were introduced into the three-necked flask and heated to 100° C. while stirring. Then, a solution prepared by dissolving 0.1 moles of diphenyl dichlorosilane monomer (product by Chisso Kabushiki Kaisha) in 30 g of dehydrated dodecane was dropwise and slowly added to the reaction system. After its addition being completed, the reactants were subjected to condensation polymerization at 100° C. for an hour to precipitate white solids.

After cooling, 50 ml of methanol was dropwise and slowly added to treat excessive metallic sodium. The resultant was subjected to filtration to obtain the white solids, which were repeatedly washed with n-hexane and methanol to obtain a polysilane compound No. D-4 shown in Table 5.

This polysilane compound was insoluble in organic solvents such as toluene, chloroform, THF, etc. Thus, its determination was performed by FT-IR. The results obtained were as shown in Table 5.

SYNTHESIS EXAMPLES 15 TO 17

The procedures of Example 1 were repeated, except that dichlorosilane monomers and end group-treating agents shown in Table 4 were selectively used, to thereby obtain polysilane compounds Nos. 15 to 17 shown in Table 5.

The yield, the weight average molecular weight, and the results by FT-IR and FT-NMR with respect to each of the resultant polysilane compounds were shown in Table 5.

The copolymerized ratio of the silane monomer in each case was obtained by the number of protons in the NMR.

In the following, explanation is to be made on the organic photovoltaic element of junction type having an organic semiconductor layer formed of the foregoing specific polysilane compound (hereinafter simply referred to as "junction type organic photovoltaic element") to be provided according to the present invention.

The junction type organic photovoltaic element according to the present invention includes an organic photovoltaic element of MIS (Metal-Insulator-Semiconductor) junction type (hereinafter referred to as "MIS junction type organic photovoltaic element"), an organic photovoltaic element of SIS (Semiconductor-Insulator-Semiconductor) junction type (hereinafter referred to as "SIS junction type organic photovoltaic element"), and an organic photovoltaic element of Schottky junction type (hereinafter referred to as "Schottky junction type organic photovoltaic element").

Any of these junction type organic photovoltaic elements has at least an organic semiconductor layer formed of the foregoing specific polysilane compound wherein a desirable junction being formed between said organic semiconductor layer and other constituent layer. And the organic semiconductor layer in any of these junction type organic photovoltaic elements is comprised of the foregoing specific polysilane compound which is highly sensitive to light of relatively short wavelength. Thus, any of these junction type organic photovoltaic elements according to the present invention provides a high open-circuit voltage(Voc) and a desirable photoelectric conversion efficiency which cannot be attained by any of the known junction type organic photovoltaic elements.

Further, as above described, for the formation of the organic semiconductor layer of the junction type organic photovoltaic element according to the present invention, there is used the foregoing specific polysilane compound which can be easily dissolved in various solvents, has an excellent film-forming ability and makes it possible to form a homogeneous and uniform film not only on a substrate but also on other constituent layer even if it is of large area, in a state that excels in adhesion. Thus, the organic semiconductor layer comprised of the foregoing polysilane compound in the junction type organic photovoltaic element according to the present invention excels in adhesion with a substrate or other constituent layer. And it is possible for the junction type organic photovoltaic element according to the present invention to be so designed that it can be used as a solar cell capable of supplying an electric power.

Further in addition, since the organic semiconductor layer is constituted by the foregoing specific polysilane compound having a stable molecular structure, the junction type organic photovoltaic element according to the present invention excels in the photovoltaic characteristics required for a photovoltaic element, and stably provides an improved photoelectric conversion efficiency, which is surpassing that provided by the known junction type organic photovoltaic element, without being deteriorated as in the case of the known junction type organic photovoltaic element. And the junction type organic photovoltaic element according to the present invention is free of such problems of the photoelectric conversion efficiency being reduced upon repeating use for a long period of time as found in the case of the known junction type organic photovoltaic element. Further, the junction type organic photovoltaic element according to the present invention excels in heat resistance, and stably exhibits its power outputting characteristics even under such environmental conditions where temperature is severely changed.

Other than these advantages, there is a further advantage for the junction type organic photovoltaic element according to the present invention that its light absorption characteristics can be so modified that said photovoltaic element may be adapted to environmental use, by forming the organic semiconductor layer with the use of an appropriate compound one selected from the foregoing polysilane compounds represented by the foregoing formula(I).

The junction type organic photovoltaic element according to the present invention is of the configuration that light is impinged from the side of the junction interface. It is therefore necessary to prevent light from being absorbed by the metallic layer, semiconductor layer, and insulating layer as much as possible. And, the barrier height due to the work function of a metal in the metallic layer, and the barrier height and the degree of the tunneling probability of photocarrier in the insulating layer greatly govern the photocarrier collecting efficiency of the photovoltaic element. In view of this, the material to constitute each of the constituent layers and the thickness of each of the constituent layers should be properly determined having due regard to on the related factors including the kind of a material by which each of the constituent layers is constituted, etc.

In the following, there will be described typical examples of the junction type organic photovoltaic element according to the present invention. These are, however, only for illustrative purpose and not intended to restrict the present invention.

Figure 1B:
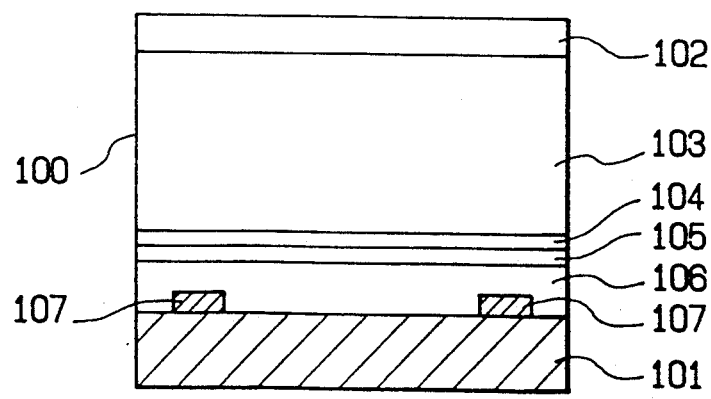

FIGS. 1(A) and 1(B) are schematic representations showing the typical configuration of the MIS junction type organic photovoltaic element having an organic semiconductor layer formed of the foregoing polysilane compound according to the present invention.

The MIS junction type organic photovoltaic element 100 shown in FIG. 1(A) is of the type that light is impinged from the side opposite to a substrate 101.

The MIS junction type organic photovoltaic element shown in FIG. 1(A) comprises a lower electrode 102, a semiconductor layer 103 formed of the foregoing polysilane compound, an insulating layer 104, a metallic layer 105, a reflection preventive layer 106 and a collecting electrode 107 being disposed in this order on the substrate.

The MIS junction type organic photovoltaic element 100 shown in FIG. 1(B) is of the type that light is impinged from the side of a transparent substrate 101, and it comprises a collecting electrode 107, a reflection preventive layer 106, a metallic layer 105, an insulating layer 104, a semiconductor layer 103 formed of the foregoing polysilane compound and a lower electrode 102 being disposed in this order on the transparent substrate 101.

Figure 2A:
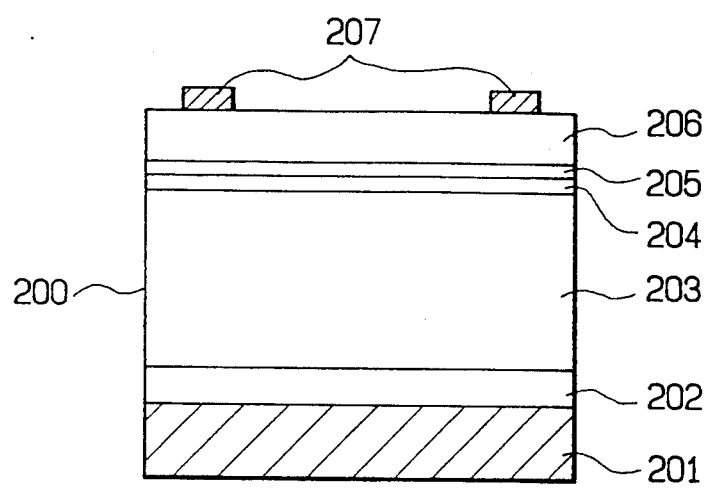
FIGS. 2(A) and 2(B) are schematic representations showing the typical configuration of a SIS junction type organic photovoltaic element according to the present invention.
Figure 2B:
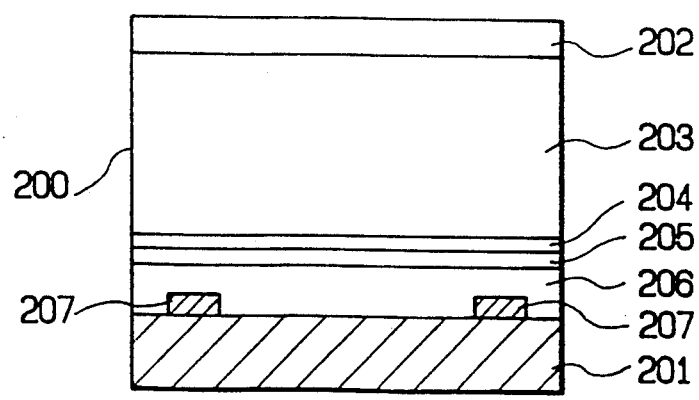

FIGS. 2(A) and 2(B) are schematic representations showing the typical configuration of the SIS junction type organic photovoltaic element having a semiconductor layer formed of the foregoing polysilane compound according to the present invention.

The SIS junction type organic photovoltaic element 200 shown in FIG. 2(A) is of the type that light is impinged from the side opposite to a substrate 201, and it comprises a lower electrode 202, a semiconductor layer 203 formed of the foregoing polysilane compound, an insulating layer 204, another semiconductor layer 205, a reflection preventive layer 206 and a collecting electrode 207 being disposed in this order on the substrate 201.

The SIS junction type organic photovoltaic element 200 shown in FIG. 2(B) is of the type that light is impinged from the side of a transparent electrode 201, and it comprises a collecting electrode 207, a reflection preventive layer 206, a semiconductor layer 105, an insulating 204, another semiconductor layer 203 formed of the foregoing polysilane compound and a lower electrode 202 being disposed in this order on the transparent electrode 201.

Figure 3A:
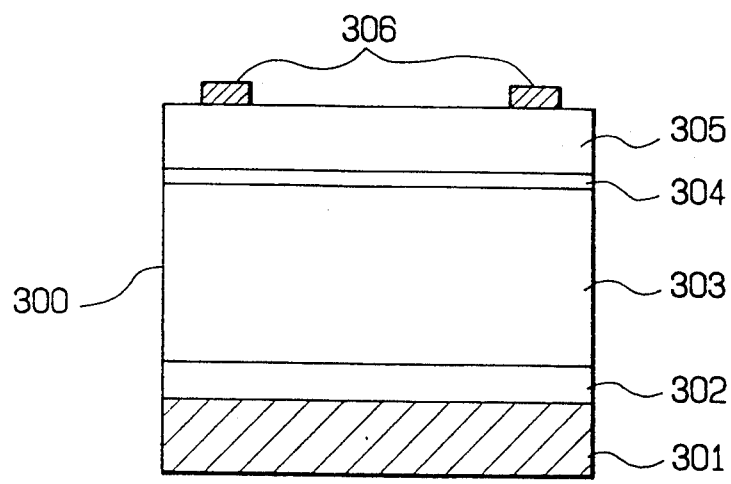
FIGS. 3(A) and 3(B) are schematic representations showing the typical configuration of a Schottky junction type organic photovoltaic element according to the present invention.
Figure 3B:
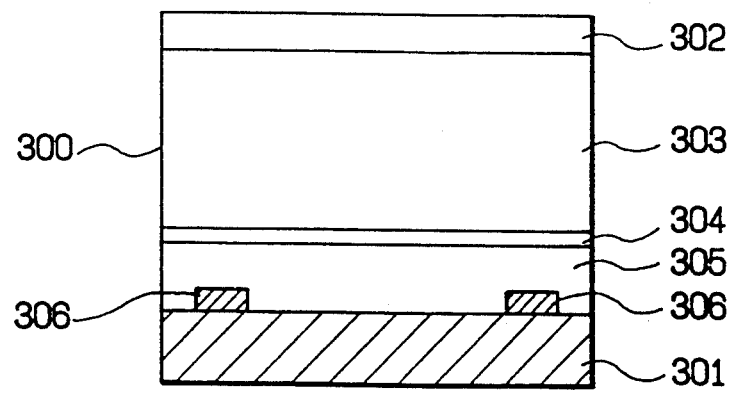

FIGS. 3(A) and 3(B) are schematic representations showing the typical configuration of the Schottky junction type organic photovoltaic element having a semiconductor layer formed of the foregoing polysilane compound.

the Schottyky junction type organic photovoltaic element 300 shown in FIG. 3(A) is of the type that light is impinged from the side opposite to a substrate 301, and it comprises a lower electrode 302, a semiconductor layer 303 formed of the foregoing polysilane compound, a metallic layer 304, a reflection preventive layer 305 and a collecting electrode 306 being disposed in this order on the substrate 301.

The Schottky junction type organic photovoltaic element 300 shown in FIG. 3(B) is of the type that light is impinged form the side of a transparent substrate 301, and it comprises a collecting electrode 306, a reflection preventive layer 305, a metallic layer 304, a semiconductor layer 303 formed of the foregoing polysilane compound and a lower electrode 302 being disposed in this order on the transparent substrate 301.

In the following, explanation will be made on each of the constituent members of these junction type organic photovoltaic elements according to the present invention, wherein the semiconductor layer formed of the foregoing polysilane compound is abbreviated to "polysilane semiconductor layer".

Polysilane Semiconductor Layer (103, 203 or 303)

The polysilane semiconductor layer is formed of one of the foregoing polysilane compounds represented by the foregoing formula (I). In a preferred embodiment, the polysilane semiconductor layer is formed of a member selected from the group consisting of the above-mentioned polysilane compounds c-1 to c-43.

Any of these polysilane compounds c-1 to c-43 has not only a good semiconductor property but also an excellent film forming property.

In order to from the polysilane semiconductor layer, for example, a predetermined amount of the above polysilane compound is dissolved in an appropriate solvent to obtain a coating liquid, a predetermined amount of the coating liquid thus obtained is applied on the surface of a constituent member no which the polysilane semiconductor layer is to be formed to form a liquid coat thereon by a known coating method such as a dip coating method, a spray coating method, a spin coating method or a wire bar coating method, etc., followed by drying at a temperature which is less than the glass-transition temperature and under the condition of not damaging said constituent member. At this drying process, it is necessary to sufficiently eliminate the solvent contained in the coat.

As for the thickness of the polysilane semiconductor layer, it is somewhat different depending upon the kind of the junction type organic photovoltaic element.

In the case of the foregoing MIS junction type, SIS junction type, or Schottky junction type organic photovoltaic element, it is made to be preferably in the range of from 1 nm to $1 \times 10^5$ nm, more preferably in the range of from 5 nm to $1 \times 10^4$ nm, most preferably in the range of from 10 nm to $5 \times 10^4$ nm.

Metallic Layer (105 or 304)

The metallic layer is formed of a material capable of providing a MIS or Schottky junction with an adjacent constituent layer disposed next to the metallic layer. Such material to constitute the metallic layer is properly determined depending upon the work function of the foregoing polysilane semiconductor layer.

In a preferred embodiment, the metallic layer is formed of a material selected from the group consisting of Au, Pt, Ag, W, Cu, Ni, etc.

As for the thickness of the metallic layer, it is necessary to be made to such an extent that allows light to sufficiently transmit through the layer. Specifically, it is preferably 1 $\mu$m or less, or more preferably, 0.8 $\mu$m or less.

The metallic layer may be formed by a conventional vacuum evaporation method, electron beam evaporation method, sputtering method, or the like using the above material.

Semiconductor Layer (205)

The semiconductor layer other than the foregoing polysilane semiconductor layer is formed of a semiconductor material exhibiting semiconductor characteristics which is capable of providing a SIS junction with an adjacent constituent layer disposed next to said semiconductor layer.

Specific examples of such semiconductor material are so-called group IV semiconductor materials of group IV elements of the Periodic Table, so-called group II-VI semiconductor materials comprising group II and VI elements of the Periodic Table, and so-called group III-V semiconductor materials comprising group III and V elements of the Periodic Table.

Specific examples of the group IV element are C, Si, Ge, Sn, etc. Specific examples of the group II element are Zn, Cd, etc. Specific examples of the group VI element are O, Se, S, Te, etc. Specific examples of the group III element are B, Al, Ga, In, etc. Specific examples of the group V element are N, P, As, Sb, etc.

Other than these semiconductor materials, there can be illustrated so-called oxide semiconductor materials such as $SnO_2$, $In_2O_3$, ZnO, CdO, ITO ($In_2O_3 + SnO_2$) which were applied with doping treatment.

As for the thickness of the semiconductor layer 205, it is necessary to be made such an extent that allows light to sufficiently transmit through the semiconductor layer into the polysilane semiconductor layer 203 positioned thereunder. Specifically, it is preferably 5 $\mu$m or less, more preferably 2 $\mu$m or less, or most preferably, 0.8 $\mu$m or less.

It is possible to make the semiconductor layer 205 to function also as the reflection preventive layer 206 by appropriately adjusting the thickness thereof.

The semiconductor layer 205 may be formed by a conventional plasma CVD method, HR-CVD method, vacuum evaporation method, electron beam evaporation method, sputtering method, etc.

Insulating Layer (104 or 204)

The insulating layer is formed of an insulating material capable of providing a MIS junction or a SIS junction with a constituent layer disposed next to the insulating layer.

Specific examples of such insulating material are metal oxides such as $SiO_2$, $Al_2O_3$, $TiO_2$, $Ta_2O_5$, etc., metal nitrides such as $Si_3N_4$, etc., various silicate glasses such as PGS, etc., and water-adsorbed oxide complexes.

As for the thickness of the insulating layer, it should be so designed that the open-circuit voltage(Voc) is not reduced because of reduction in the tunneling probability of photocarrier and increase in the barrier height. Specifically, it is preferably in the range of from 5 to 30 Å, or more preferably in the range of from 5 to 20 Å.

The insulating layer may be formed by a conventional physically film-forming method such as sputtering method, vapor deposition method, etc., or a conventional vapor-phase chemically film-forming method such as plasma CVD method.

Substrate (101, 201 or 301)

The substrate may be electrically conductive or insulating, and it may be transparent or opaque. In the case where the junction type organic photovoltaic element is of the type that light is impinged from the side of the substrate, the substrate is required to be transparent.

Examples of the substrate include metals such as Fe, Ni, Cr, Mg, Al, Mo, Ta, V, Ti, Nb, Pb, Au, Ag, Pt, etc., and alloys of these metals such as stainless steel, duralmin, nichrome, brass, etc. Additional examples of the substrate include synthetic resins (in the form of film or sheet) such as polyester, polyethylene, polycarbonate, cellulose acetate, polypropylene, polyvinyl chloride, polyvinylidene chloride, polystyrene, polyamide, polyimide, polyethyleneterephthalate,etc, and other than these, glass and ceramics.

The substrate may be of single crystal or polycrystal material. The single crystal or polycrystal substrate may be formed by slicing into wafers a single crystal or polycrystal of Si, Ge, NaCl, $CaF_2$, LiF or $BaF_2$. The wafer may have an epitaxially grown layer of the same substance as the wafer or of a substance having a lattice constant close to that of the wafer.

The substrate may take on any shape according to the intended object and application. It may be a flat plate, belt, or cylinder, each having a smooth surface or irregular surface. The thickness of the substrate may be properly so decided as to be suitable for a junction type organic photovoltaic element to be obtained. For a junction type organic photovoltaic element which is required to be flexible, the substrate can be made as thin as possible so long as it functions satisfactorily. Usually, the substrate is made to be thicker than 10 $\mu$m from the viewpoints of manufacturing and handling efficiencies and mechanical strength.

Electrodes

For the junction type organic photovoltaic element of the present invention, relevant electrodes are selectively used depending upon the configuration of the element. Specifically, there are used a lower electrode and collecting electrode. These electrodes will be explained in the following.

(i) Lower Electrode (102, 202 or 302)

The lower electrode in the junction type organic photovoltaic element of the present invention is used for current output from the polysilane semiconductor layer. Because of this, it is required for the lower electrode to have a sufficient ohmic contact with the polysilane semiconductor layer.

The lower electrode is placed in a different position depending on whether the above-mentioned substrate is transparent or opaque.

In the case of the configuration shown in FIG. 1(A), 2(A) or 3(A), the lower electrode is placed between the substrate (101, 201 or 301) and the polysilane semiconductor layer (103, 203 or 303). However, in the case where the substrate is electrically conductive, it may function also as the lower electrode in any case. In the case where the substrate is insulating or it is electrically conductive but has a high sheet resistance, the lower electrode is necessary to be installed for current output.

In the case of the configuration shown in FIG. 1(B), 2(B) or 3(B), the substrate (101, 201 or 301) is made of a transparent material, wherein light is impinged from the side of the substrate. Therefore, the lower electrode is placed at the position opposite to the substrate and above the polysilane semiconductor layer not only for current output but also for light reflection at the electrode.

The lower electrode may be made of a member selected from the group consisting of metals such as Al, Mg, Cr, Cu, Ag, Au, Pt, Ti, Mo, W, etc., and alloys of these metals. These members to constitute the lower electrode are selectively used depending upon the characteristics of the polysilane semiconductor layer.

The lower electrode may be formed by forming one of these metals and alloys into a thin film in accordance with a conventional vacuum evaporation method, electron beam evaporation method or sputtering method. The thin film thus formed to constitute the lower electrode should have a sheet resistance value preferably of 50Ω or less, or more preferably of 10Ω or less.

(ii) Collecting Electrode (107, 207 or 306)

The collecting electrode in the junction type organic photovoltaic element of the present invention is placed on the reflection preventive layer (106, 206 or 305) in order to reduce the surface resistance of each of the metallic layer 105 and the reflection preventive layer 106, the surface resistance of each of the semiconductor layer 205 and the reflection preventive layer 206, and the surface resistance of the reflection preventive layer 305.

The collecting electrode is comprised of a thin film made of a member selected from the group consisting of metals such as Ag, Cr, Ni, Al, Au, Pt, Ti, W, Mo and Cu, and alloys of these metals. The thin film may be comprised at a laminated layer. The shape and area of the thin film are designed so that light can be sufficiently impinged into the semiconductor layer. For example, it may spread all over the light receiving surface of the photovoltaic element, and it may have an area preferably of 15% or less, or more preferably of 10% or less, of the light receiving surface. The sheet resistance is desired to be preferably 50Ω or less, or more preferably 10Ω or less.

Reflection Preventive Layer (106, 206 or 305)

In the junction type organic photovoltaic element of the present invention, the reflection preventive layer is used in order to improve the light collecting efficiency of the photovoltaic element. In the case of the junction type organic photovoltaic element of the configuration shown in FIG. 1 or FIG. 2, the semiconductor layer 105 or 205 may be so designed as to function also as the reflection preventive layer 106 or 206.

The reflection protective layer is required to exhibit an ability of preventing occurrence of an optical reflection and to function as an electrode for current output from the semiconductor layer. Therefore, the reflection preventive layer is desired to be formed of a material having a transmittance of more than 85% in the visible light region. The reflection preventive layer may be comprised of a plurality of thin films having different refractive indexes which are laminated.

As for the thickness of the reflection preventive layer, it should be properly determined so as to comply with the conditions desired for the reflection preventive layer. But in general, it is about 0.8 μm.

As for the electrical conductivity of the reflection preventive layer, it is necessary it be made such that current output of the photovoltaic element is not hindered. In this connection, the reflection preventive layer is desired to be of less than 100Ω in sheet resistance.

As the foregoing material to constitute the reflection preventive layer, there can be mentioned metal oxides such as $SnO_2$, $In_2O_3$, ZnO, CdO, ITO ($In_2O_3+SnO_2$), etc.

The formation of the reflection preventive layer using these materials may be carried out by a conventional reactive resistance heat evaporation method, electron beam evaporation method, reactive sputtering method, spraying method, etc.

Now, in order to form a MIS junction, a SIS junction or a Schottky junction upon preparing the junction type organic photovoltaic element of the present invention, it is desired to form at least the interface between the polysilane semiconductor layer and the insulating layer, the interface between the insulating layer and the metallic layer or the semiconductor layer, and the interface between the polysilane semiconductor layer and the metallic layer respectively in a vacuum atmosphere or in an atmosphere comprising inert gas.

DESCRIPTION OF THE PREFERRED EMBODIMENTS

The junction type organic photovoltaic element of the present invention will be described in more detail with reference to the following examples, which are not intended to restrict the scope of the invention.

EXAMPLE 1

In this example, there was prepared a MIS junction type organic photovoltaic element of the configuration shown in FIG. 1(A).

Firstly, as the substrate 101, there was provided a stainless steel plate of 100 mm × 100 mm × 0.2 mm in size having a cleaned surface. This substrate was placed in a sputtering apparatus having a target comprising Ag (99.9999% in purity) therein, which was evacuated to a vacuum of less than $1 \times 10^{-5}$ Torr. Ar gas as a sputtering gas was introduced into the sputtering apparatus and the inside thereof was maintained at 5 mTorr. RF power of 200 W was applied to cause discharge, to thereby sputter the target. Thus, there was formed a about 1200 Å thick Ag thin film to be the lower electrode 102 on the substrate at room temperature.

Separately, there was provided a coating liquid for the formation of the polysilane semiconductor layer 103 by dissolving 200 parts by weight of the foregoing polysilane compound No. 1 (c-1), which was obtained in Synthesis Example 1, in one liter of sufficiently dehydrated toluene. The coating liquid was introduced into a spin coater placed in a glove box charged with Ar gas.

The substrate having the Ag thin film previously formed thereon was taken out from the sputtering apparatus under an inert atmosphere comprising Ar gas, and soon after this, it was set to the above spin coater placed in the glove box. At the time of transferring said substrate to the spin coater, there was used a carrier box charged with Ar gas. There was formed a 2000 Å thick polysilane film to be the polysilane semiconductor layer 103 at room temperature in a Ar gas stream by the spin coater. The substrate having the polysilane film formed thereon was subjected to drying at 70 °C. in a Ar gas stream to remove the solvent contained in the polysilane film.

The substrate was transferred into a carrier box charged with Ar gas, then it was set to a RF plasma CVD apparatus. The RF plasma CVD apparatus was evacuated to a vacuum of less than $10^{-3}$ Torr while heating the substrate to a temperature of 70° C. The substrate was maintained at this temperature. $SiH_4$ gas and $O_2$ gas were introduced into the RF plasma CVD apparatus at respective flow rates of 2 sccm and 0.5 sccm. The inner pressure of the RF plasma CVD apparatus was regulated to and maintained at 0.3 Torr. Then, RF power of 20 W was applied into the RF plasma CVD apparatus to cause discharge, to thereby form a 10 Å thick $SiO_2$ film to be the insulating layer 104 on the previously formed polysilane semiconductor layer.

The substrate was transferred into a carrier box charged with Ar gas, then it was set to a DC magnetron sputtering apparatus having a target comprising Al of 99.9999% in purity therein wherein the substrate was heated to and maintained at 70° C. Ar gas as a sputtering gas was introduced into the sputtering apparatus, and the inner pressure thereof was regulated to and maintained at 5 mTorr. The target was sputtered at a sputtering voltage of 380 V, to thereby form a 50Å thick Al thin film to be the metallic layer 105 on the previously formed insulating layer 104. After the formation of the metallic layer 105 being terminated, the foregoing target was replaced by a target comprising a sintered $In_2O_3$-$SnO_2$ body. A gaseous mixture comprising Ar/$O_2$/$H_2$ (100/40/1) as a sputtering gas was introduced into the DC magnetron sputtering apparatus. The inner pressure of the sputtering apparatus was regulated to and maintained at 4 mTorr. The target was sputtered at a sputtering voltage of 380 V, to thereby form a 700 Å thick ITO film to be the reflection preventive layer 106 on the previously formed metallic layer 105.

After cooling, the substrate was removed. With a permalloy mask placed on the reflection preventive layer 106, the substrate was placed in a vacuum evaporation apparatus, which was evacuated to less than $1 \times 10^{-5}$ Torr. An Ag thin film of 1 μm in thickness was deposited by the resistance heating method to form the comb-shaped collecting electrode 107. Thus there was obtained a MIS junction type organic photovoltaic element (Element Sample No. 1).

The characteristic properties of Element Sample No. 1 were evaluated in the following manner.

Firstly, the photoelectric conversion efficiency which is provided when light of 480 nm in wavelength and 0.1 mW/cm$^2$ in intensity was irradiated onto Element Sample No. 1 from the side of its reflection preventive layer 106 was measured. Further, the photoelectric conversion efficiency thereof which is provided when the intensity of the light to be irradiated is changed to 0.2 mW/cm$^2$ and 0.3 mW/cm$^2$ respectively without changing the wavelength was measured. In addition, after this Element Sample No. 1 being irradiated with AM-1 light (100 mW/cm$^2$) for 10 hours, the above manner of measuring the photoelectric conversion efficiency (using light of 480 nm in wavelength and 0.1 mW/cm$^2$) was repeated to measure its photoelectric conversion efficiency, whereby observing the situation of a change between the initial photoelectric conversion efficiency and the last photoelectric conversion efficiency.

Further in addition, Element Sample No. 1 was set to a bending tester, wherein bending cycle was repeated 1000 times, to thereby evaluate the film adhesion. As for the sample after being subjected to the bending test, its photoelectric conversion efficiency was observed.

The evaluated results were as shown in Table 6.

From the results shown in Table 6, it was recognized that the photovoltaic element obtained in this example is such that provides a high photoelectric conversion efficiency without being influenced by changes in the intensity of light to be irradiated and without being deteriorated, excels in the film adhesion and is satisfactory in the mechanical strength.

EXAMPLES 2 TO 5

The procedures of Example 1 were repeated, except that as the polysilane compound for the formation of the polysilane semiconductor layer 103, there were used polysilane compounds Nos. 2 to 5 obtained in Synthesis Examples 2 to 5, to thereby obtain Element Samples Nos. 2 to 5. Each of these samples was evaluated in the same manner as in Example 1.

The evaluated results were as shown in Table 6.

From the results shown in Table 6, it was recognized that any of Element Samples No. 2 to 5 is such that provides a high photoelectric conversion efficiency without being influenced by changes in the intensity of light to be irradiated and without being deteriorated, excels in the film adhesion and is satisfactory in the mechanical strength.

EXAMPLES 6 TO 10

The procedures of Example 1 were repeated, except that instead of the polysilane compound No. 1 for the formation of the polysilane semiconductor layer 103, polysilane compounds Nos. 6 to 10 which were obtained in Synthesis Examples 6 to 10 were used; as the lower electrode 102, a 1500 Å thick Cr thin film was formed instead of the Ag thin film; as the insulating layer 104, a 15 Å thick $Si_3N_4$ thin film was formed instead of the $SiO_2$ film; and as the metallic layer 105, a 30 Å thick Au thin film was formed in stead of the Al thin film, to thereby obtain Element Samples No. 6 to 10. Each of these samples was evaluated in the same manner as in Example 1.

The evaluated results were as shown in Table 6.

From the results shown in Table 6, it was recognized that any of Element Samples Nos. 6 to 10 is such that provides a high photoelectric conversion efficiency without being influenced by changes in the intensity of light to be irradiated and without being deteriorated, excels in the film adhesion and is satisfactory in the mechanical strength.

EXAMPLES 11 TO 14

The procedures of Example 1 were repeated, except that instead of the polysilane compound No. 1 for the formation of the polysilane semiconductor layer 103, polysilane compounds Nos. 11 to 14 which were obtained in Synthesis Examples 11 to 14 were used; and as the insulating layer 104, a 10 Å thick PSG thin film was formed instead of the $SiO_2$ thin film, to thereby obtain Element Samples Nos. 11 to 14. Each of these samples was evaluated in the same manner as in Example 1.

The evaluated results were as shown in Table 6.

From the results shown in Table 6, it was recognized that any of Element Samples Nos. 11 to 14 is such that provides a high photoelectric conversion efficiency without being influenced by changes in the intensity of light to be irradiated and without being deteriorated, excels in the film adhesion and is satisfactory in the mechanical strength.

EXAMPLES 15 TO 17

The procedures of Example 1 were repeated, except that instead of the polysilane compound No. 1 for the formation of the polysilane semiconductor layer 103, polysilane compounds Nos. 15 to 17 which were obtained in Synthesis Examples 15 to 17 were used, to thereby obtain Element Samples Nos. 15 to 17. Each of these samples was evaluated in the same manner as in Example 1.

The evaluated results were as shown in Table 7.

From the results shown in Table 7, it was recognized that any of Element Samples Nos. 15 to 17 is such that provides a high photoelectric conversion efficiency without being influenced by changes in the intensity of light to be irradiated and without being deteriorated, excels in the film adhesion and is satisfactory in the strength.

EXAMPLES 18 TO 21

The procedures of Examples 1, 6, 11 and 15 were repeated, except that instead of the stainless steel plate as the substrate 101, a plate made of PET (100 um in thickness) was used in each case, to thereby obtain Element Samples Nos. 18 to 21. Each of these samples was evaluated in the same manner as in Example 1.

The evaluated results were as shown in Table 7.

From the results shown in Table 7, it was recognized that any of Element Samples Nos. 18 to 21 is such that provides a high photoelectric conversion efficiency without being influenced by changes in the intensity of light to be irradiated and without being deteriorated, excels in the film adhesion and is satisfactory in the mechanical strength.

EXAMPLE 22

The procedures of Example 1 were repeated, except that instead of the stainless steel plate as the substrate 101, a $n^+Si$ single crystal wafer of 5 inch in size was used, to thereby obtain an Element Sample No. 22.

Onto this sample, light from a monochromator was irradiated from the side of its reflection preventive layer to measure a light collecting efficiency thereof. As a result, it was found that the light collecting efficiency in the visible light region exhibiting the maximum absorption is 65%. Further, the value for FF upon irradiation of sun light of 80 mW/cm$^2$ was 0.52.

EXAMPLE 23

In this example, there was prepared a SIS junction type organic photovoltaic element of the configuration shown in FIG. 2(A). The SIS junction type organic photovoltaic element prepared in this example was so made that the semiconductor layer 205 functions also as the reflection preventive layer 206.

Firstly, as the substrate 201, there was provided a stainless steel plate of 100 mm × 100 mm × 0.2 mm in size having a cleaned surface. This substrate was placed in a sputtering apparatus having a target comprising Ag (99.9999% in purity) therein, which was evacuated to a vacuum of less than $1 \times 10^{-5}$ Torr. Ar gas as a sputtering gas was introduced into the sputtering apparatus and the inside thereof was maintained at 5 mTorr. RF power of 200 W was applied to cause discharge, to thereby sputter the target. Thus, there was formed about 1500 Å thick Ag thin film to be the lower electrode 202 on the substrate 201 at room temperature.

Separately, there was provided a coating liquid for the formation of the polysilane semiconductor layer 203 by dissolving 200 parts by weight of the foregoing polysilane compound No. 1 (c-1), which was obtained in Synthesis Example 1, in one liter of sufficiently dehydrated toluene. The coating liquid thus obtained was introduced into a spin coater placed in a glove box charged with Ar gas.

The substrate having the Ag thin film previously formed thereon was taken out from the sputtering apparatus under an inert atmosphere comprising Ar gas, and soon after this, it was set to the above spin coater placed in the glove box. At the time of transferring said substrate to the spin coater, there was used a carrier box charged with Ar gas. There was formed a 3000 Å thick polysilane film to be the polysilane semiconductor layer 203 at room temperature in a Ar gas stream by the spin coater. The substrate having the polysilane film formed thereon was subjected to drying at 70° C. in a Ar gas stream to remove the solvent contained in the polysilane film.

The substrate was transferred into a carrier box charged with Ar gas, then it was set to a RF plasma CVD apparatus. The RF plasma CVD apparatus was evacuated to a vacuum of less than $10^{-3}$ Torr while heating the substrate to a temperature of 70° C. The substrate was maintained at this temperature. SiH$_4$ gas and O$_2$ gas were introduced into the RF plasma CVD apparatus at respective flow rates of 2.5 sccm and 0.6 sccm. The inner pressure of the RF plasma CVD apparatus was regulated to and maintained at 0.4 Torr. Then, RF power of 30 W was applied into the RF plasma CVD apparatus to cause discharge, to thereby form a 15 Å thick SiO$_2$ film to be the insulating layer 204 on the previously formed polysilane semiconductor layer 203.

The substrate was transferred into a carrier box charged with Ar gas, then it was set to a DC magnetron sputtering apparatus having a target comprising a sintered In$_2$O$_3$-SnO$_2$ body, wherein the substrate was heated to and maintained at 70° C. A gaseous mixture comprising Ar/O$_2$/H$_2$ (100/40/1) as a sputtering gas and PH$_3$ gas as a doping gas were introduced into the sputtering apparatus, and the inner pressure thereof was regulated to and maintained at 3.5 mTorr. The target was sputtered at a sputtering voltage of 420 V, to thereby form a 720 Å thick n-type ITO film to be the semiconductor layer 205 capable of functioning also as the reflection preventive layer 206 on the previously formed insulating layer 204.

After cooling, the substrate was removed. With a permalloy mask placed on the semiconductor layer 205 capable of functioning also as the reflection preventive layer 206, the substrate was placed in a vacuum evaporation apparatus, which was evacuated to less than $1 \times 10^{-5}$ Torr. An Ag thin film of 1 μm in thickness was deposited by the resistance heating method to form the comb-shaped collecting electrode 207. Thus there was obtained a SIS junction type organic photovoltaic element (Element Sample No. 23).

The characteristic properties of Element Sample No. 23 thus obtained were evaluated in the same manner as in Example 1.

The evaluated results were as shown in Table 8.

From the results shown in Table 8, it was recognized that the photovoltaic element obtained in this example is such that provides a high photoelectric conversion efficiency without being influenced by changes in the intensity of light to be irradiated and without being deteriorated, excels in the film adhesion and is satisfactory in the mechanical strength.

EXAMPLES 24 TO 27

The procedures of Example 23 were repeated, except that instead of the polysilane compound No. 1 for the formation of the polysilane semiconductor layer 203, there were used polysilane compounds Nos. 2 to 5 obtained in Synthesis Examples 2 to 5, to thereby obtain Element Samples Nos. 24 to 27. Each of these samples was evaluated in the same manner as in Example 1.

The evaluated results were as shown in Table 8.

From the results shown in Table 8, it was recognized that any of Element Samples No. 24 to 27 is such that provides a high photoelectric conversion efficiency without being influenced by changes in the intensity of light to be irradiated and without being deteriorated, excels in the film adhesion and is satisfactory in the mechanical strength.

EXAMPLES 28 TO 32

The procedures of Example 23 were repeated, except that instead of the polysilane compound No. 1 for the formation of the polysilane semiconductor layer 203, polysilane compounds Nos. 6 to 10 which were obtained in Synthesis Examples 6 to 10 were used; as the lower electrode 202, a 1800 Å thick Cr thin film was formed in stead of the Ag thin film; as the insulating layer 204, a 10 Å thick $Si_3N_4$ thin film was formed instead of the $SiO_2$ film; and as the semiconductor layer 205, a 710 Å thick p-type SiC thin film was formed instead of the n-type ITO thin film, to thereby obtain Element Samples No. 28 to 32. Each of these samples was evaluated in the same manner as in Example 1.

The evaluated results were as shown in Table 8.

From the results shown in Table 8, it was recognized that any of Element Samples Nos. 28 to 32 is such that provides a high photoelectric conversion efficiency without being influenced by changes in the intensity of light to be irradiated and without being deteriorated, excels in the film adhesion and is satisfactory in the mechanical strength.

EXAMPLES 33 TO 36

The procedures of Example 23 were repeated, except that instead of the polysilane compound No. 1 for the formation of the polysilane semiconductor layer 203, polysilane compounds Nos. 11 to 14 which were obtained in Synthesis Examples 11 to 14 were used; and as the insulating layer 204, a 10 Å thick PSG thin film was formed instead of the $SiO_2$ thin film, to thereby obtain Element Samples Nos. 33 to 36. Each of these samples was evaluated in the same manner as in Example 1.

The evaluated results were as shown in Table 8.

From the results shown in Table 8, it was recognized that any of Element Samples Nos. 33 to 36 is such that provides a high photoelectric conversion efficiency without being influenced by changes in the intensity of light to be irradiated and without being deteriorated, excels in the film adhesion and is satisfactory in the mechanical strength.

EXAMPLES 37 TO 39

The procedures of Example 23 were repeated, except that instead of the polysilane compound No. 1 for the formation of the polysilane semiconductor layer 203, polysilane compounds Nos. 15 to 17 which were obtained in Synthesis Examples 15 to 17 were used; the thickness of the n-type ITO film to constitute the semiconductor layer 205 was changed to 350 Å A in each case; and a 340 Å thick ITO film to be the reflection preventive layer 206 was formed by repeating the procedures of forming the n-type ITO film except for not using the $PH_3$ gas in each case, to thereby obtain Element Samples Nos. 37 to 39. Each of these samples was evaluated in the same manner as in Example 1.

The evaluated results were as shown in Table 9.

From the results shown in Table 9, it was recognized that any of Element Samples Nos. 37 to 39 is such that provides a high photoelectric conversion efficiency without being influenced by changes in the intensity of light to be irradiated and without being deteriorated, excels in the film adhesion and is satisfactory in the mechanical strength.

EXAMPLES 40 TO 43

The procedures of Examples 23, 28, 33 and 37 were repeated, except that instead of the stainless steel plate as the substrate 201, a plate made of PET (100 um in thickness) was used in each case, to thereby obtain Element Samples Nos. 40 to 43. Each of these samples was evaluated in the same manner as in Example 1.

The evaluated results were as shown in Table 9.

From the results shown in Table 9, it was recognized that any of Element Samples Nos. 40 to 43 is such that provides a high photoelectric conversion efficiency without being influenced by changes in the intensity of light to be irradiated and without being deteriorated, excels in the film adhesion and is satisfactory in the mechanical strength.

EXAMPLE 44

The procedures of Example 23 were repeated, except that instead of the stainless steel plate as the substrate 201, an $n^+Si$ single crystal wafer of 5 inch in size was used, to thereby obtain an Element Sample No. 44. Onto this sample, light from a monochromator was irradiated from the side of its reflection preventive layer to measure a light collecting efficiency thereof. As a result, it was found that the light collecting efficiency in the visible light region exhibiting the maximum absorption is 62%. Further, the value for FF upon irradiation of sun light of 80 mW/cm$^2$ was 0.52.

EXAMPLE 45

In this example, there was prepared a Schottky junction type organic photovoltaic element of the configuration shown in FIG. 3(A).

Firstly, as the substrate 301, there was provided a stainless steel plate of 100 mm × 100 mm × 0.2 mm in size having a cleaned surface. This substrate was placed in a sputtering apparatus having a target comprising Ag (99.9999% in purity) therein, which was evacuated to a vacuum of less than $1 \times 10^{-5}$ Torr. Ar gas as a sputtering gas was introduced into the sputtering apparatus and the inside thereof was maintained at 4 mTorr. RF power of 200 W was applied to cause discharge, to thereby sputter the target. Thus, there was formed a about 1000 Å thick Ag thin film to be the lower electrode 302 on the substrate 301 at room temperature.

Separately, there was provided a coating liquid for the formation of the polysilane semiconductor layer 303 by dissolving 250 parts by weight of the foregoing polysilane compound No. 1 (c-1), which was obtained in Synthesis Example 1, in one liter of sufficiently dehydrated toluene. The coating liquid was introduced into a spin coater placed in a glove box charged with Ar gas.

The substrate 301 having the Ag thin film previously formed thereon was taken out from the sputtering apparatus under an inert atmosphere comprising Ar gas, and soon after this, it was set to the above spin coater placed in the glove box. At the time of transferring said substrate to the spin coater, there was used a carrier box charged with Ar gas. There was formed a 2200 Å thick polysilane film to be the polysilane semiconductor layer 303 at room temperature in a Ar gas stream by the spin coater. The substrate having the polysilane film formed thereon was subjected to drying at 70° C. in a Ar gas stream to remove the solvent contained in the polysilane film. Thus there was formed the polysilane semiconductor layer 303.

The substrate was transferred into a carrier box charged with Ar gas, then it was set to a DC magnetron sputtering apparatus having a target comprising Al of 99.9999% in purity, wherein the substrate was heated to and maintained at 70° C. Ar gas as a sputtering gas was introduced into the sputtering apparatus, and the inner pressure thereof was regulated to and maintained at 4.5 mTorr. The target was sputtered at a sputtering voltage of 350 V, to thereby form a 40 Å thick Al thin film to be the metallic layer 304 on the previously formed polysilane semiconductor layer 303. After the formation of the metallic layer 304 being terminated, the foregoing target was replaced by a target comprising a sintered In$_2$O$_3$-SnO$_2$ body. A gaseous mixture comprising Ar-/O$_2$/H$_2$ (100/40/1) as a sputtering gas was introduced into the DC magnetron sputtering apparatus. The inner pressure of the sputtering apparatus was regulated to and maintained at 5 mTorr. The target was sputtered at a sputtering voltage of 400 V, to thereby form a 680 Å thick ITO film to be the reflection preventive layer 305 on the previously formed metallic layer 304.

After cooling, the substrate was removed. With a permalloy mask placed on the reflection preventive layer 305, the substrate was placed in a vacuum evaporation apparatus, which was evacuated to less than $1 \times 10^{-5}$ Torr A 1 μm thick Ag thin film was deposited by the resistance heating method to form the comb-shaped collecting electrode 306. Thus there was obtained a Schottky junction type organic photovoltaic element (Element Sample No. 45).

The characteristic properties of Element Sample No. 45 were evaluated in the same manner as in Example 1.

The evaluated results were as shown in Table 10.

From the results shown in Table 10, it was recognized that the photovoltaic element obtained in this example is such that provides a high photoelectric conversion efficiency without being influenced by changes in the intensity of light to be irradiated and without being deteriorated, excels in the film adhesion and is satisfactory in the mechanical strength.

EXAMPLES 46 TO 49

The procedures of Example 45 were repeated, except that instead of the polysilane compound No. 1 for the formation of the polysilane semiconductor layer 303, there were used polysilane compounds Nos. 2 to 5 obtained in Synthesis Examples 2 to 5, to thereby obtain Element Samples Nos. 46 to 49. Each of these samples was evaluated in the same manner as in Example 1.

The evaluated results were as shown in Table 10.

From the results shown in Table 10, it was recognized that any of Element Samples No. 46 to 49 is such that provides a high photoelectric conversion efficiency without being influenced by changes in the intensity of light to be irradiated and without being deteriorated, excels in the film adhesion and is satisfactory in the mechanical strength.

EXAMPLES 50 TO 54

The procedures of Example 45 were repeated, except that instead of the polysilane compound No. 1 for the formation of the polysilane semiconductor layer 303, polysilane compounds Nos. 6 to 10 which were obtained in Synthesis Examples 6 to 10 were used; as the lower electrode 302, a 1200 Å thick Cr thin film was formed in stead of the Ag thin film; and as the metallic layer 304, a 35 Å thick Au thin film was formed instead of the Al thin film, to thereby obtain Element Samples No. 50 to 54. Each of these samples was evaluated in the same manner as in Example 1.

The evaluated results were as shown in Table 10.

From the results shown in Table 10, it was recognized that any of Element Samples Nos. 50 to 54 is such that provides a high photoelectric conversion efficiency without being influenced by changes in the intensity of light to be irradiated and without being deteriorated, excels in the film adhesion and is satisfactory in the mechanical strength.

EXAMPLES 55 TO 58

The procedures of Example 45 were repeated, except that instead of the polysilane compound No. 1 for the formation of the polysilane semiconductor layer 303, polysilane compounds Nos. 11 to 14 which were obtained in Synthesis Examples 11 to 14 were used, to thereby obtain Element Samples Nos. 55 to 58. Each of these samples was evaluated in the same manner as in Example 1.

The evaluated results were as shown in Table 10.

From the results shown in Table 10, it was recognized that any of Element Samples Nos. 55 to 58 is such that provides a high photoelectric conversion efficiency without being influenced by changes in the intensity of light to be irradiated and without being deteriorated, excels in the film adhesion and is satisfactory in the mechanical strength.

EXAMPLES 59 TO 61

The procedures of Example 45 were repeated, except that instead of the polysilane compound No. 1 for the formation of the polysilane semiconductor layer 303, polysilane compounds Nos. 15 to 17 which were obtained in Synthesis Examples 15 to 17 were used; and as the metallic layer 304, a 30 Å thick Au thin film was formed instead of the Al thin film in each case, to thereby obtain Element Samples Nos. 59 to 61. Each of these samples was evaluated in the same manner as in Example 1.

The evaluated results were as shown in Table 11.

From the results shown in Table 11, it was recognized that any of Element Samples Nos. 59 to 61 is such that provides a high photoelectric conversion efficiency without being influenced by changes in the intensity of light to be irradiated and without being deteriorated, excels in the film adhesion and is satisfactory in the mechanical strength.

EXAMPLES 62 TO 65

The procedures of Examples 45, 50, 55 and 59 were repeated, except that instead of the stainless steel plate as the substrate 301, a plate made of PET (100 um in thickness) was used in each case, to thereby obtain Element Samples Nos. 62 to 65. Each of these samples was evaluated in the same manner as in Example 1.

The evaluated results were as shown in Table 11.

From the results shown in Table 11, it was recognized that any of Element Samples Nos. 62 to 65 is such that provides a high photoelectric conversion efficiency without being influenced by changes in the intensity of light to be irradiated and without being deteriorated, excels in the film adhesion and is satisfactory in the mechanical strength.

EXAMPLE 66

The procedures of Example 45 were repeated, except that instead of the stainless steel plate as the substrate 301, a n+Si single crystal wafer was used, to thereby obtain an Element Sample No. 66. Onto this sample, light from a monochromator was irradiated from the side of its reflection preventive layer to measure a light collecting efficiency thereof. As a result, it was found that the light collecting efficiency in the visible light region exhibiting the maximum absorption is 63%. Further, the value for FF upon irradiation of sun light of 80 mW/cm$^2$ was 0.5

TABLE 1

|  | dichlorosilane monomer | terminal group treating agent |
|---|---|---|
| Synthesis Example 4 | a-7 0.1 mole | b-8 0.01 mole |
| Synthesis Example 5 | a-7 0.1 mole | b-5 0.01 mole |
| Comparative Synthesis Example 1 | a-7 0.1 mole | — |

TABLE 2

|  | dichlorosilane monomer | dichlorosilane condensation period (minuite) | terminal group treating agent |
|---|---|---|---|
| Synthesis Example 6 | a-13 0.1 mole | 180 | b-3 0.01 mole |
| Synthesis Example 7 | a-13 0.1 mole | 120 | b-7 0.01 mole |
| Synthesis Example 8 | a-13 0.1 mole | 90 | b-12 0.01 mole |
| Synthesis Example 9 | a-13 0.1 mole | 60 | b-8 0.01 mole |
| Synthesis Example 10 | a-13 0.1 mole | 30 | b-5 0.01 mole |
| Comparative Synthesis Example 2 | a-13 0.1 mole | 10 | b-3 0.01 mole |

TABLE 3

|  | dichlorosilane monomer | | terminal group treating agent |
|---|---|---|---|
| Synthesis Example 11 | a-1 0.05 mole | a-13 0.05 mole | b-15 0.01 mole |
| Synthesis Example 12 | a-1 0.05 mole | a-13 0.05 mole | b-7 0.01 mole |
| Synthesis Example 13 | a-13 0.05 mole | a-19 0.05 mole | b-3 0.01 mole |
| Synthesis Example 14 | a-13 0.05 mole | a-19 0.05 mole | b-8 0.01 mole |
| Comparative Synthesis Example 3 | $(CH_3)_2SiCl_2$ 0.1 mole | — | — |
| Comparative Synthesis Example 4 |  | — | — |

TABLE 4

|  | dichlorosilane monomer | | terminal group treating agent |
|---|---|---|---|
| Synthesis Example 15 | a-2 0.07 mole | a-15 0.03 mole | b-2 0.01 mole |
| Synthesis Example 16 | a-17 0.07 mole | a-15 0.03 mole | b-8 0.01 mole |
| Synthesis Example 17 | a-17 0.07 mole | a-15 0.03 mole | b-15 0.01 mole |

TABLE 5

| Synthesis Example | polysilane compound No. | formula $A\text{---}\underset{R_2}{\overset{R_1}{\left[\text{Si}\right]_n}}\underset{R_4}{\overset{R_3}{\left[\text{Si}\right]_m}}\text{---}A$ | yield [%] | M.W. | FT-NMR H δ [ppm] | FT-IR [cm⁻¹] | Cl radical (millimolar equivalent in 1000 g) |
|---|---|---|---|---|---|---|---|
| Synthesis Example 1 | 1 | CH₃(CH₂)₅—[Si(CH₃)]ₙ—[Si(C₆H₅)(CH₃)]ₘ—(CH₂)₅CH₃ | 65 | 75,000 | Si—CH₃ 0.60; C₆H₅—Si 7.21; —CH₃ 1.10; Si—CH₂ 1.10; —(CH₂)₇— 1.61 | 2960, 2862; 1610, 1433, 1020; 1470, 1456 | 0.00 |
| Synthesis Example 2 | 2 | [Si(CH₃)(C₆H₅)]ₙ with (C₆H₅)₂ branch | 72 | 92,000 | Si—CH₃ 0.60; C₆H₅—Si 7.21 | 2960, 2862; 1610, 1434, 1022; 735 | 0.00 |
| Synthesis Example 3 | 3 | [Si(CH₃)(CH₂C₆H₅)]ₙ with C₆H₅ group | 61 | 47,000 | Si—CH₃ 0.60; C₆H₅—Si 7.21; Si—CH₂— 1.78; —CH₂—C₆H₅ 7.25 | 2960, 2861; 1610, 1434, 1022; 1456 | 0.00 |
| Synthesis Example 4 | 4 | [Si(CH₃)(p-CH₃C₆H₄)]ₙ with p-tolyl groups | 60 | 51,000 | Si—CH₃ 0.60; C₆H₄ 7.20; CH₃ 2.26 | 2960, 2861; 1610, 1434, 1022; 1455 | 0.00 |
| Synthesis Example 5 | 5 | [Si(CH₃)(C₆H₅)]ₙ with cyclohexyl group | 62 | 49,000 | Si—CH₃ 0.60; C₆H₅—Si 7.20; C₆H₁₁—Si (2.03, 1.57) | 2960, 2862; 1610, 1434, 1020; 2930, 1355, 1170 | 0.00 |

TABLE 5-continued

| polysilane compound No. | formula $A\!-\!\!\left(\!Si\!\right)_{\!m}\!\!\begin{array}{c}R_1\\|\\|\\R_2\end{array}\!\!\left(\!Si\!\right)_{\!m}\!\!\begin{array}{c}R_3\\|\\|\\R_4\end{array}\!\!\!-\!A$ | yield [%] | M.W. | FT-NMR 1Hδ [ppm] | FT-IR [cm⁻¹] | Cl radical (millimolar equivalent in 1000 g) |
|---|---|---|---|---|---|---|
| Comparative Synthesis Example 1 D-1 | Cl—(Si)ₙ—Cl with CH₃, phenyl | 60 | 46,000 | Si—CH₃ 0.60; phenyl 7.20 | Si—CH₃ 2960, 2862; Si—phenyl 1610, 1434, 1020; Si—Cl 530; Si—O—Si 1110 | 38.0 |
| Synthesis Example 6 | CH₃(CH₂)₅—(Si)ₙ—(CH₂)₅CH₃ with CH₃, cyclohexyl | 58 | 120,000 | Si—CH₃ 0.60; Si—cyclohexyl {1.58, 2.04}; Si—CH₂—CH₃ / —(CH₂)₅— 1.10; 1.6 | Si—CH₃ 2960, 2880; Si—cyclohexyl {2930, 2958, 1450, 1170}; C—CH₃ 1470 | 0.00 |
| Synthesis Example 7 | (Si)ₙ with CH₃, cyclohexyl, phenyl, phenyl | 61 | 72,000 | Si—CH₃ 0.60; Si—cyclohexyl {1.58, 2.04}; Si—phenyl 7.22 | Si—CH₃ 2960, 2881; Si—cyclohexyl {2930, 2958, 1451, 1172}; Si—phenyl 1600, 1434, 1022 | 0.00 |
| Synthesis Example 8 | (Si)ₙ with CH₃, cyclohexyl, CH₂—phenyl, phenyl | 72 | 69,000 | Si—CH₃ 0.60; Si—cyclohexyl {1.58, 2.04}; Si—CH₂— 1.78; CH₂—phenyl 7.25 | Si—CH₃ 2960, 2880; Si—cyclohexyl {2930, 2958, 1451, 1172}; Si—CH₂— 1456; CH₂—phenyl 1590 | 0.00 |
| Synthesis Example 9 | (Si)ₙ with CH₃, cyclohexyl, p-tolyl, p-tolyl | 45 | 46,000 | Si—CH₃ 0.60; Si—cyclohexyl {1.58, 2.04}; Si—p-tolyl 7.20; CH₃ 2.26 | Si—CH₃ 2960, 2880; Si—cyclohexyl {2930, 2958, 1451, 1172}; Si—p-tolyl 1630, 1455; CH₃—phenyl 1455 | 0.00 |

TABLE 5-continued

| polysilane compound No. | formula $A\!-\!\!\left[\!\begin{array}{c}R_1\\Si\\R_2\end{array}\!\right]_n\!\!\left[\!\begin{array}{c}R_3\\Si\\R_4\end{array}\!\right]_m\!\!-\!A$ | yield [%] | M.W. | FT-NMR H δ [ppm] | FT-IR [cm$^{-1}$] | Cl radical (millimolar equivalent in 1000 g) |
|---|---|---|---|---|---|---|
| Synthesis Example 10 | 10 | CH₃−[Si]₁.₀−⌬ (cyclohexyl) | 50 | 8,000 | Si—CH₃ 0.60; ⌬(Si) {1.58, 2.04} | Si—CH₃, ⌬-Si 2960, 2880 (2930, 2958, 1451, 1172) | 0.00 |
| Comparative Synthesis Example 2 | D-2 | CH₃(CH₂)₁₀−[Si]ₘ−⌬ ; CH₃−[Si]ₙ−(CH₂)₅CH₃ | 30 | 3,000 | Si—CH₃ 0.60; ⌬ {1.58,2.04}; Si—CH₂—CH₃ 1.10; —(CH₂)₅— 1.60 | Si—CH₃, ⌬-Si, C—CH₃ 2960, 2880 (2930, 2958, 1450, 1170) 1470 | 0.00 |
| Synthesis Example 11 | 11 | CH₃(CH₂)₁₀−[Si(CH₃)]₀.₅−[Si(CH₃)]ₘ−(CH₂)₁₀CH₃ ; ⌬ branch | 55 | 71,000 | Si—CH₃ 0.60; ⌬ {1.58,2.04}; Si—CH₂—CH₃ 1.10; —(CH₂)ₙ— 1.60 | Si—CH₃, ⌬-Si, C—CH₃ 2960, 2880 (2930, 2958, 1450, 1170) 1470 | 0.00 |
| Synthesis Example 12 | 12 | Ph−[Si(CH₃)]₀.₅−[Si(CH₃)]ₘ−Ph | 60 | 59,000 | Si—CH₃ 0.60; ⌬ {1.58, 2.04}; ⬡ 7.22 | Si—CH₃, ⌬-Si, ⬡-Si 2960, 2881 (2931, 2958, 1451, 1172) 1600, 1434, 1022 | 0.00 |
| Synthesis Example 13 | 13 | CH₃(CH₂)₅−[Si((CH₂)₃CH₃)]₀.₅−[Si(CH₃)]ₘ−(CH₂)₅CH₃ ; ⌬ branch | 63 | 69,000 | Si—CH₃ 0.60; ⌬ {1.58,2.04}; Si—CH₂—CH₃ 1.10; —(CH₂)ₙ— 1.60 | Si—CH₃, ⌬-Si, C—CH₃ 2960, 2880 (2930, 2958, 1450, 1170) 1470 | 0.00 |

TABLE 5-continued

| Synthesis Example | polysilane compound No. | formula | yield [%] | M.W. | FT-NMR Hδ [ppm] | FT-IR [cm⁻¹] | Cl radical (millimolar equivalent in 1000 g) |
|---|---|---|---|---|---|---|---|
| Synthesis Example 14 | 14 | [structure with cyclohexyl and tolyl groups] | 62 | 58,000 | Si—CH₃ 0.60; Si—cyclohexyl 1.58, 2.04; Si—CH₂—CH₃, —(CH₂)— 1.10; Si—phenyl 1.60; 7.20; Ar—CH₃ 2.26 | Si—CH₃ 2961, 2880; Si—cyclohexyl 2931, 2958, 1450, 1170; C—CH₃ 1470; Si—phenyl 1630, 1455; Ar—CH₃ | 0.00 |
| Comparative Synthesis Example 3 | D-3 | CH₃—Si(CH₃)₂—Cl with Cl | 30 | — | — | Si—CH₃ 2960, 2880; Si—Cl 530; Si—O—Si 1110 | |
| Comparative Synthesis Example 4 | D-4 | Cl—Si(Ph)₂—Cl | 25 | — | — | Si—phenyl 1610, 1434, 1020; Si—Cl 528; Si—O—Si 1110 | |
| Synthesis Example 15 | 15 | CH₃(CH₂)₄—[Si(CH₃)(phenyl)]—[Si(CH₃)₀.₅]—(CH₂)₄CH₃ | 62 | 78,000 | Si—CH₃ 0.60; Si—phenyl 7.20; Si—CH₂—CH₃, —(CH₂)— 1.10; 1.60 | Si—CH₃ 2960, 2880; Si—phenyl 1610, 1435, 1020; C—CH₃ 1470; —(CH₂)— 1455 | |
| Synthesis Example 16 | 16 | [structure with tolyl, phenyl, C₂H₅ groups] | 65 | 72,000 | Si—CH₃ 0.60; Si—phenyl 7.20; Si—CH₂—CH₃ 1.10; Ar—CH₃ 2.26 | Si—CH₃ 2960, 2881; Si—phenyl 1610, 1435, 1020; Ar—CH₃ | |

TABLE 5-continued

| polysilane compound No. | formula | yield [%] | M.W. | FT-NMR H δ [ppm] | | FT-IR [cm⁻¹] | | Cl radical (millimolar equivalent in 1000 g) |
|---|---|---|---|---|---|---|---|---|
| Synthesis Example 17 | 17 $CH_3(CH_2)_{10}$—$\left[\begin{array}{c}CH_3\\|\\Si\\|\\\bigcirc\end{array}\right]_{0.5}$—$\left[\begin{array}{c}CH_3\\|\\Si\\|\\C_2H_5\end{array}\right]_{0.5}$—$(CH_2)_{10}CH_3$ | 67 | 58,000 | Si—CH₃<br>Si—⬡<br>Si—CH₂—<br>—CH₃<br>—(CH₂)₁₀— | 0.60<br>7.20<br>1.10<br>1.60 | Si—CH₃<br>Si—⬡<br>C—CH₃<br>—(CH₂)— | 2960, 2880<br>{1610, 1432<br>1024<br>1470<br>1455 | |

TABLE 6

| Example No. | Element No. | photoelectric conversion efficiency (%) light intensity (mW/cm²) | | | change in the photoelectric conversion efficiency after continuous irradiation of AM-1 light for 10 hours (%) | adhesion | change in the photoelectric conversion efficiency after being bent (%) |
|---|---|---|---|---|---|---|---|
| | | 0.1 | 0.2 | 0.3 | | | |
| 1 | 1 | 2.7 | 2.7 | 2.6 | 7.5 | ☺ | 3.5 |
| 2 | 2 | 2.4 | 2.4 | 2.3 | 7.3 | ○ | 4.5 |
| 3 | 3 | 2.5 | 2.5 | 2.5 | 7.8 | ☺ | 3.5 |
| 4 | 4 | 2.5 | 2.4 | 2.4 | 7.6 | ☺ | 3.5 |
| 5 | 5 | 2.3 | 2.3 | 2.2 | 7.4 | ☺ | 3.5 |
| 6 | 6 | 1.8 | 1.8 | 1.8 | 7.8 | ○ | 5.5 |
| 7 | 7 | 1.9 | 1.9 | 1.8 | 7.5 | ○ | 4.0 |
| 8 | 8 | 2.0 | 2.0 | 1.9 | 7.4 | ☺ | 3.5 |
| 9 | 9 | 1.9 | 1.9 | 1.8 | 7.4 | ☺ | 3.5 |
| 10 | 10 | 1.8 | 1.8 | 1.7 | 7.5 | ○ | 4.5 |
| 11 | 11 | 1.8 | 1.8 | 1.8 | 7.2 | ○ | 4.5 |
| 12 | 12 | 1.9 | 1.9 | 1.8 | 7.3 | ☺ | 3.5 |
| 13 | 13 | 1.6 | 1.6 | 1.5 | 7.5 | ○ | 4.5 |
| 14 | 14 | 1.7 | 1.7 | 1.6 | 7.6 | ○ | 4.5 |

TABLE 7

| Example No. | Element No. | photoelectric conversion efficiency (%) light intensity (mW/cm²) | | | change in the photoelectric conversion efficiency after continuous irradiation of AM-1 light for 10 hours (%) | adhesion | change in the photoelectric conversion efficiency after being bent (%) |
|---|---|---|---|---|---|---|---|
| | | 0.1 | 0.2 | 0.3 | | | |
| 15 | 15 | 2.3 | 2.3 | 2.2 | 7.2 | ☺ | 3.5 |
| 16 | 16 | 2.5 | 2.5 | 2.4 | 7.4 | ○ | 5.0 |
| 17 | 17 | 2.4 | 2.3 | 2.3 | 7.3 | ☺ | 3.5 |
| 18 | 18 | 2.5 | 2.5 | 2.4 | 7.5 | ☺ | 3.5 |
| 19 | 19 | 1.7 | 1.7 | 1.7 | 7.6 | ○ | 4.5 |
| 20 | 20 | 1.7 | 1.7 | 1.6 | 7.7 | ○ | 4.5 |
| 21 | 21 | 2.2 | 2.2 | 2.1 | 7.4 | ☺ | 3.5 |

TABLE 8

| Example No. | Element No. | photoelectric conversion efficiency (%) light intensity (mW/cm²) | | | change in the photoelectric conversion efficiency after continuous irradiation of AM-1 light for 10 hours (%) | adhesion | change in the photoelectric conversion efficiency after being bent (%) |
|---|---|---|---|---|---|---|---|
| | | 0.1 | 0.2 | 0.3 | | | |
| 23 | 23 | 2.4 | 2.4 | 2.3 | 7.6 | ☺ | 3.5 |
| 24 | 24 | 2.1 | 2.1 | 2.1 | 7.5 | ○ | 4.5 |
| 25 | 25 | 2.2 | 2.2 | 2.3 | 7.7 | ☺ | 3.5 |
| 26 | 26 | 2.3 | 2.3 | 2.2 | 7.5 | ☺ | 3.5 |
| 27 | 27 | 2.0 | 2.0 | 2.0 | 7.3 | ○ | 4.0 |
| 28 | 28 | 1.5 | 1.5 | 1.4 | 7.8 | ○ | 5.0 |
| 29 | 29 | 1.7 | 1.7 | 1.6 | 7.6 | ○ | 4.5 |
| 30 | 30 | 1.8 | 1.8 | 1.7 | 7.7 | ☺ | 3.5 |
| 31 | 31 | 1.7 | 1.7 | 1.8 | 7.4 | ☺ | 3.5 |
| 32 | 32 | 1.7 | 1.7 | 1.7 | 7.6 | ○ | 4.5 |
| 33 | 33 | 1.6 | 1.6 | 1.5 | 7.5 | ○ | 4.0 |
| 34 | 34 | 1.7 | 1.7 | 1.8 | 7.4 | ☺ | 3.5 |
| 35 | 35 | 1.5 | 1.5 | 1.4 | 7.3 | ○ | 4.5 |
| 36 | 36 | 1.6 | 1.7 | 1.6 | 7.5 | ○ | 4.0 |

TABLE 9

| Example No. | Element No. | photoelectric conversion efficiency (%) light intensity (mW/cm²) | | | change in the photoelectric conversion efficiency after continuous irradiation of AM-1 light for 10 hours (%) | adhesion | change in the photoelectric conversion efficiency after being bent (%) |
|---|---|---|---|---|---|---|---|
| | | 0.1 | 0.2 | 0.3 | | | |
| 37 | 37 | 2.2 | 2.2 | 2.1 | 7.3 | ☺ | 3.5 |
| 38 | 38 | 2.3 | 2.3 | 2.3 | 7.6 | ○ | 4.5 |
| 39 | 39 | 2.1 | 2.1 | 2.0 | 7.2 | ○ | 4.0 |
| 40 | 40 | 2.3 | 2.3 | 2.4 | 7.4 | ☺ | 3.5 |

TABLE 9-continued

| Example No. | Element No. | photoelectric conversion efficiency (%) light intensity (mW/cm²) 0.1 | 0.2 | 0.3 | change in the photoelectric conversion efficiency after continuous irradiation of AM-1 light for 10 hours (%) | adhesion | change in the photoelectric conversion efficiency after being bent (%) |
|---|---|---|---|---|---|---|---|
| 41 | 41 | 1.5 | 1.6 | 1.6 | 7.7 | ○ | 4.5 |
| 42 | 42 | 1.6 | 1.6 | 1.5 | 7.5 | ○ | 4.0 |
| 43 | 43 | 2.0 | 2.0 | 2.1 | 7.6 | ⊙ | 3.5 |

TABLE 10

| Example No. | Element No. | photoelectric conversion efficiency (%) light intensity (mW/cm²) 0.1 | 0.2 | 0.3 | change in the photoelectric conversion efficiency after continuous irradiation of AM-1 light for 10 hours (%) | adhesion | change in the photoelectric conversion efficiency after being bent (%) |
|---|---|---|---|---|---|---|---|
| 45 | 45 | 2.4 | 2.4 | 2.3 | 7.6 | ⊙ | 3.5 |
| 46 | 46 | 2.1 | 2.1 | 2.1 | 7.5 | ○ | 4.5 |
| 47 | 47 | 2.2 | 2.2 | 2.3 | 7.7 | ⊙ | 3.5 |
| 48 | 48 | 2.3 | 2.3 | 2.2 | 7.5 | ⊙ | 3.5 |
| 49 | 49 | 2.0 | 2.0 | 2.0 | 7.3 | ○ | 4.0 |
| 50 | 50 | 1.5 | 1.5 | 1.4 | 7.8 | ○ | 5.0 |
| 51 | 51 | 1.7 | 1.7 | 1.6 | 7.6 | ○ | 4.5 |
| 52 | 52 | 1.8 | 1.8 | 1.7 | 7.7 | ⊙ | 3.5 |
| 53 | 53 | 1.7 | 1.7 | 1.8 | 7.4 | ⊙ | 3.5 |
| 54 | 54 | 1.7 | 1.7 | 1.7 | 7.6 | ○ | 4.5 |
| 55 | 55 | 1.6 | 1.6 | 1.5 | 7.5 | ○ | 4.0 |
| 56 | 56 | 1.7 | 1.7 | 1.8 | 7.4 | ⊙ | 3.5 |
| 57 | 57 | 1.5 | 1.5 | 1.4 | 7.3 | ○ | 4.5 |
| 58 | 58 | 1.6 | 1.7 | 1.6 | 7.5 | ○ | 4.0 |

TABLE 11

| Example No. | Element No. | photoelectric conversion efficiency (%) light intensity (mW/cm²) 0.1 | 0.2 | 0.3 | change in the photoelectric conversion efficiency after continuous irradiation of AM-1 light for 10 hours (%) | adhesion | change in the photoelectric conversion efficiency after being bent (%) |
|---|---|---|---|---|---|---|---|
| 59 | 59 | 2.2 | 2.2 | 2.1 | 7.3 | ⊙ | 3.5 |
| 60 | 60 | 2.3 | 2.3 | 2.3 | 7.6 | ○ | 4.5 |
| 61 | 61 | 2.1 | 2.1 | 2.0 | 7.2 | ○ | 4.0 |
| 62 | 62 | 2.3 | 2.3 | 2.4 | 7.4 | ⊙ | 3.5 |
| 63 | 63 | 1.5 | 1.6 | 1.6 | 7.7 | ○ | 4.5 |
| 64 | 64 | 1.6 | 1.6 | 1.5 | 7.5 | ○ | 4.0 |
| 65 | 65 | 2.0 | 2.0 | 2.1 | 7.6 | ⊙ | 3.5 |

What we claim is:

1. An improved junction type photovoltaic element, comprising an organic semiconductor layer formed of a polysilane compound of 6000 to 200000 in weight average molecular weight which is represented by the following general formula (I):

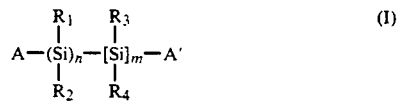

wherein, $R_1$ is an alkyl group of 1 to 2 carbon atoms; $R_2$ is an alkyl group, cycloalkyl group, aryl group or aralkyl group of 3 to 8 carbon atoms; $R_3$ is an alkyl group of 1 to 4 carbon atoms; $R_4$ is an alkyl group of 1 to 4 carbon atoms; A and A' are independently an alkyl group, cycloalkyl group, aryl group or aralkyl group of 4 to 12 carbon atoms wherein the two substituents may be the same or different one from the other; and n and m each is a mole ratio of the number of Si monomers designated to the total number of Si monomers in the polysilane wherein $n+m=1$, $0<n\leq 1$ and $0\leq m<1$.

2. A junction type photovoltaic element according to claim 1, wherein A and A' in the general formula (I) are independently an alkyl group of 4 to 12 carbon atoms, a cycloalkyl group of 4 to 12 carbon atoms, an aryl group of 4 to 12 carbon atoms or an aralkyl group of 4 to 12 carbon atoms.

3. A junction type photovoltaic element according to claim 1 which is of a Semiconductor Insulator-Semiconductor junction type.

4. A junction type photovoltaic element according to claim 1 which is of a Metal-Insulator-Semiconductor junction type.

5. A junction type photovoltaic element according to claim 1 which is of a Schottky junction type.

* * * * *

UNITED STATES PATENT AND TRADEMARK OFFICE
CERTIFICATE OF CORRECTION

PATENT NO. : 5,220,181
DATED : June 15, 1993
INVENTOR(S) : MASAHIRO KANAI, ET AL.

It is certified that error appears in the above-identified patent and that said Letters Patent is hereby corrected as shown below:

ON TITLE PAGE

In [57] ABSTRACT:
Formula (I), "$[Si]_m$" should read --$(Si)_m$--.
Line 6, "albyl" should read --alkyl--.

COLUMN 1

Line 30, "to use" should read --to the use--.

COLUMN 3

Line 23, "area" should read --are a--.

COLUMN 4

Line 20, "these" should read --These--.
Line 60, "$[Si]_m$" should read --$(Si)_m$--.
Line 64, "albyl" should read --alkyl--.

COLUMN 17

Line 54, "system" should read --system,--.

COLUMN 18

Line 49, "Further in addition," should read --Further,--.

COLUMN 20

Line 35, "anreacted" should read --unreacted--.

UNITED STATES PATENT AND TRADEMARK OFFICE
CERTIFICATE OF CORRECTION

PATENT NO. : 5,220,181
DATED : June 15, 1993
INVENTOR(S) : MASAHIRO KANAI, ET AL.

It is certified that error appears in the above-identified patent and that said Letters Patent is hereby corrected as shown below:

COLUMN 28

Line 25, "necessary" should read --necessary that--.

COLUMN 30

Line 62, "in stead" should read --instead--.

COLUMN 33

Line 53, "in stead" should read --instead--.

COLUMN 35

Line 67, "Torr" should read --Torr.--.

COLUMN 36

Line 40, "in stead" should read --instead--.

COLUMN 37

Line 57, "0.5" should read --0.5.--.

COLUMN 38

TABLE 2, "(minuite)" should read --(minutes)--.

COLUMN 51

Line 57, "[Si]$_m$" should read --(Si)$_m$--.

UNITED STATES PATENT AND TRADEMARK OFFICE
CERTIFICATE OF CORRECTION

PATENT NO. : 5,220,181
DATED : June 15, 1993
INVENTOR(S) : MASAHIRO KANAI, ET AL.

It is certified that error appears in the above-identified patent and that said Letters Patent is hereby corrected as shown below:

COLUMN 52

Line 59, "claim 1" should read --claim 1,--.
Line 62, "claim 1" should read --claim 1,--.
Line 65, "claim 1" should read --claim 1,--.

Signed and Sealed this

Third Day of May, 1994

*Attest:*

BRUCE LEHMAN

*Attesting Officer*     *Commissioner of Patents and Trademarks*